(12) United States Patent
Tseng et al.

(10) Patent No.: US 12,159,672 B2
(45) Date of Patent: Dec. 3, 2024

(54) HYBRID IMS CAM CELL, MEMORY DEVICE AND DATA SEARCH METHOD

(71) Applicant: MACRONIX INTERNATIONAL CO., LTD., Hsinchu (TW)

(72) Inventors: Po-Hao Tseng, Taichung (TW); Yu-Hsuan Lin, Taichung (TW); Tian-Cih Bo, Zhubei (TW); Feng-Min Lee, Hsinchu (TW); Yu-Yu Lin, New Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 163 days.

(21) Appl. No.: 18/162,728

(22) Filed: Feb. 1, 2023

(65) Prior Publication Data
US 2024/0257873 A1 Aug. 1, 2024

(51) Int. Cl.
*G11C 16/04* (2006.01)
*G11C 15/04* (2006.01)

(52) U.S. Cl.
CPC .................. *G11C 15/046* (2013.01)

(58) Field of Classification Search
CPC ................................... G11C 16/0483
See application file for complete search history.

(56) References Cited

U.S. PATENT DOCUMENTS

| 8,169,808 | B2 | 5/2012 | Roohparvar |
| 9,208,880 | B2 | 12/2015 | Louie |
| 2015/0270005 | A1* | 9/2015 | Choi ........................ G11C 8/18 365/185.11 |
| 2021/0407595 | A1 | 12/2021 | Advani |
| 2022/0359033 | A1 | 11/2022 | Iwasaki |

* cited by examiner

*Primary Examiner* — Jason Lappas
(74) *Attorney, Agent, or Firm* — McClure, Qualey & Rodack, LLP

(57) ABSTRACT

A hybrid in-memory search (IMS) content addressable memory (CAM) cell includes: a first IMS CAM cell; and a second IMS CAM cell, coupled to the first IMS CAM cell. The first IMS CAM cell and the second IMS CAM cell are of different types. When the hybrid IMS CAM cell stores a storage data, the first IMS CAM cell stores a first part of the storage data and the second IMS CAM cell stores the storage data or a second part of the storage data.

24 Claims, 26 Drawing Sheets

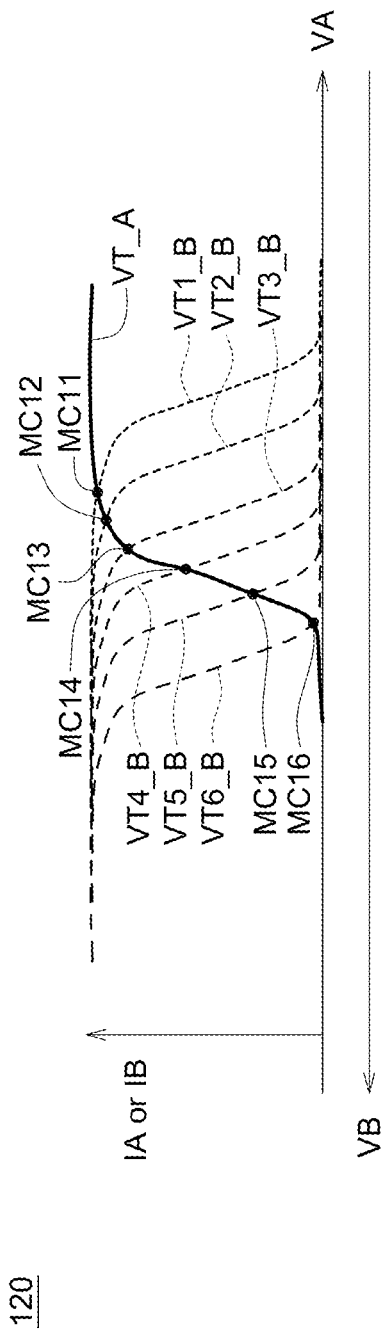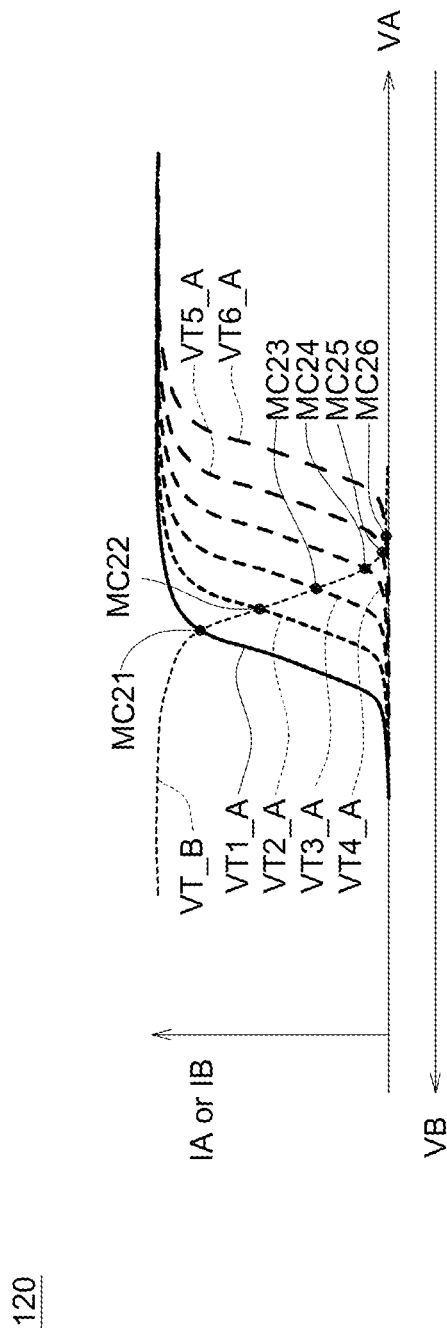

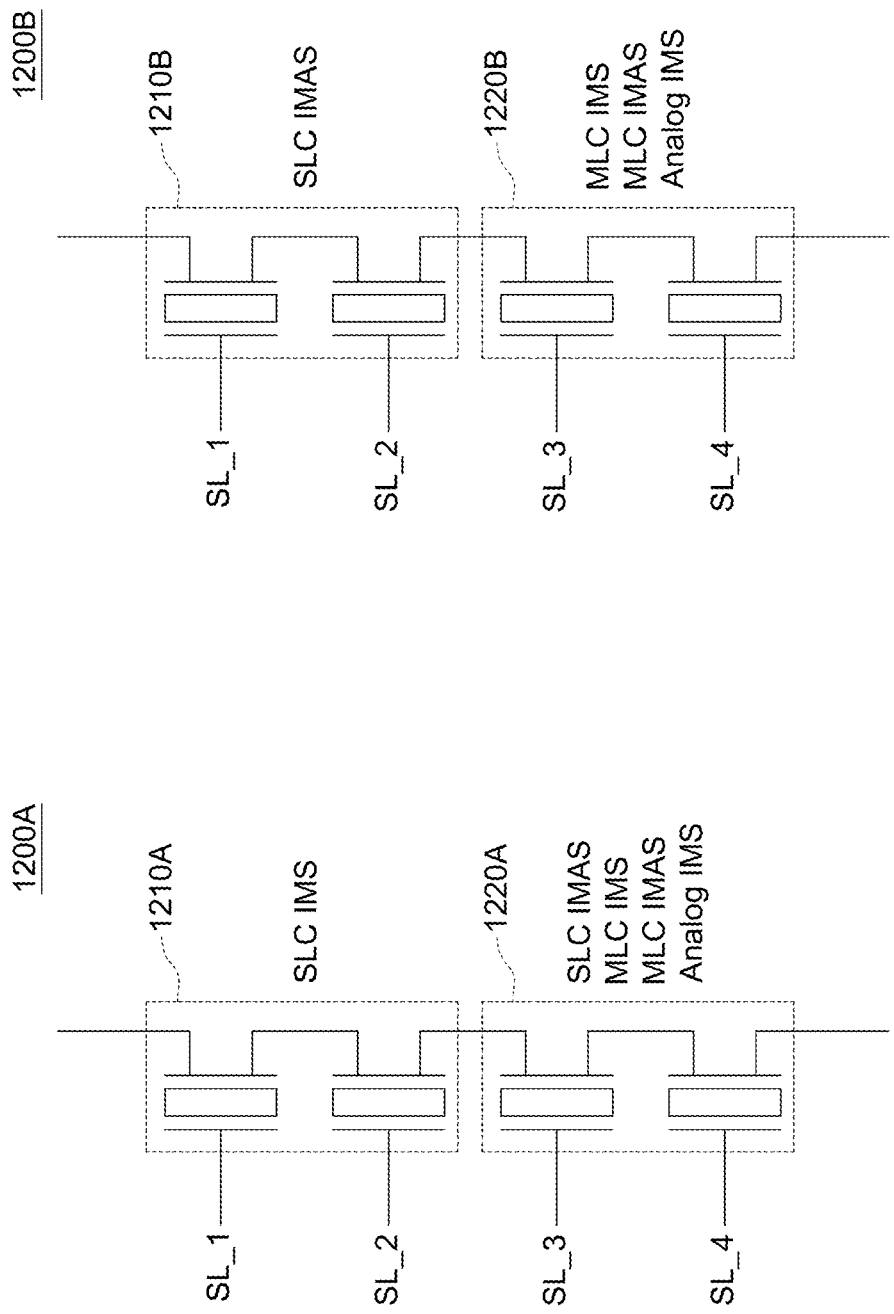

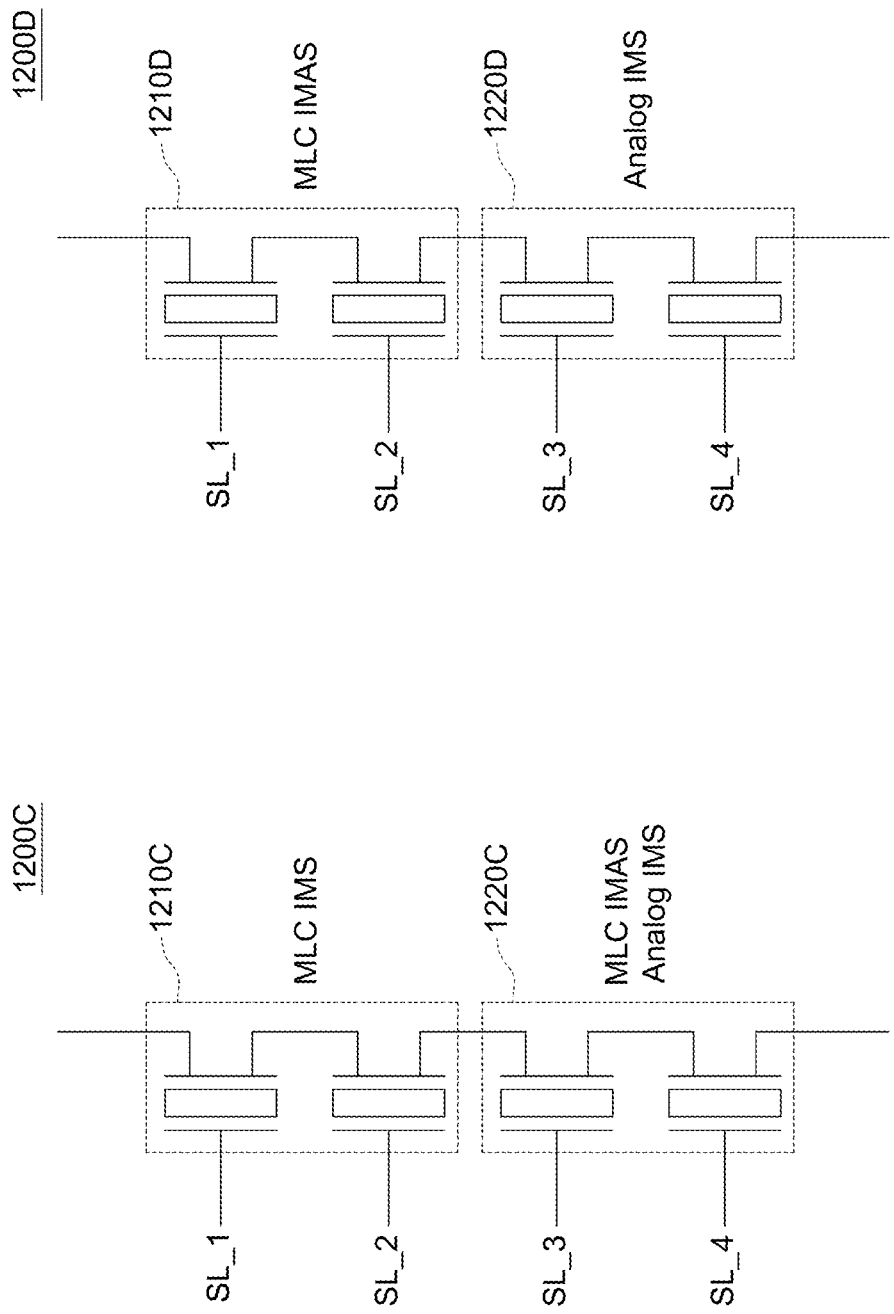

US 12,159,672 B2

HYBRID IMS CAM CELL, MEMORY DEVICE AND DATA SEARCH METHOD

TECHNICAL FIELD

The disclosure relates in general to a hybrid in-memory search (IMS) content addressable memory (CAM) cell, a hybrid IMS CAM memory device an a hybrid IMS CAM data search method.

BACKGROUND

Along with the booming growth in big data and artificial intelligence (AI) hardware accelerator, data search and data comparison have become essential functions. The existing ternary content addressable memory (TCAM) can be configured to implement highly parallel searching. Conventional TCAM is normally formed by static random access memory (SRAM), and therefore has low memory density and requires high access power. Recently, a non-volatile memory array based on TCAM has been provided to save power consumption through dense memory density.

The existing NAND-based in-memory searching (IMS) functions execute exact-matching operation. However, the exact-matching operations limit the matching flexibility. In-memory approximate searching (IMAS) cell can provide approximate matching which is a new concept for providing fuzzy comparison function to improve matching flexibility.

Thus, there needs a new IMS CAM implementation which is proposed for getting high inference accuracy, high content density, and stable searching system.

SUMMARY

According to one embodiment, a hybrid in-memory search (IMS) content addressable memory (CAM) cell is provided. The hybrid in-memory search (IMS) content addressable memory (CAM) cell includes: a first IMS CAM cell; and a second IMS CAM cell, coupled to the first IMS CAM cell, wherein, the first IMS CAM cell and the second IMS CAM cell are of different types, and when the hybrid IMS CAM cell stores a storage data, the first IMS CAM cell stores a first part of the storage data and the second IMS CAM cell stores the storage data or a second part of the storage data.

According to another embodiment, provided is a hybrid in-memory search (IMS) content addressable memory (CAM) memory device including: a hybrid IMS CAM memory array including a plurality of hybrid IMS CAM cells, a plurality of word lines and a plurality of bit lines, the hybrid IMS CAM cells coupled to the plurality of word lines and the plurality of bit lines; a word line driving circuit coupled to the word lines, based on a plurality of search data, the word line driving circuit applying a plurality of search voltages to the hybrid IMS CAM cells for searching the hybrid IMS CAM cells; a bit line driving circuit coupled to the bit lines, for applying a plurality of bit line driving voltages to the bit lines; and a sensing amplifier coupled to the hybrid IMS CAM cells, for receiving a plurality of sensing currents from the hybrid IMS CAM cells to decide whether the search data is matched with a plurality of storage data stored in the hybrid IMS CAM cells. The hybrid IMS CAM cell includes a first IMS CAM cell and a second IMS CAM cell, coupled to the first IMS CAM cell. The first IMS CAM cell and the second IMS CAM cell are of different types. When the hybrid IMS CAM cell stores a storage data, the first IMS CAM cell stores a first part of the storage data and the second IMS CAM cell stores the storage data or a second part of the storage data. In data searching, a first part of the search data is decoded into a first search voltage and a second search voltage for searching the first part of the storage data stored in the first IMS CAM cell, and the search data or a second part of the search data is decoded into a third search voltage and a fourth search voltage for searching the storage data or the second part of the storage data stored in the second IMS CAM cell.

According to an alternative embodiment, provided is a hybrid in-memory search (IMS) content addressable memory (CAM) data search method including: storing a storage data in a hybrid IMS CAM cell, the hybrid IMS CAM cell including a first IMS CAM cell and a second IMS CAM cell, coupled to the first IMS CAM cell, wherein the first IMS CAM cell and the second IMS CAM cell are of different types, and when the hybrid IMS CAM cell stores the storage data, the first IMS CAM cell stores a first part of the storage data and the second IMS CAM cell stores the storage data or a second part of the storage data; searching the hybrid IMS CAM cell by a search data, wherein in data searching, a first part of the search data is decoded into a first search voltage and a second search voltage for searching the first part of the storage data stored in the first IMS CAM cell, and the search data or a second part of the search data is decoded into a third search voltage and a fourth search voltage for searching the storage data or the second part of the storage data stored in the second IMS CAM cell; sensing a sensing current from the hybrid IMS CAM cell to generate a sensing result; and determining whether the search data is matched with the storage data based on the sensing result.

BRIEF DESCRIPTION OF THE DRAWINGS

FIG. 6A and FIG. 6B show the match current of the analog IMS CAM cell according one embodiment of the application.

FIG. 12A to FIG. 12D shows several different examples of the hybrid IMS CAM cell according to embodiments of the application.

Figure 1:
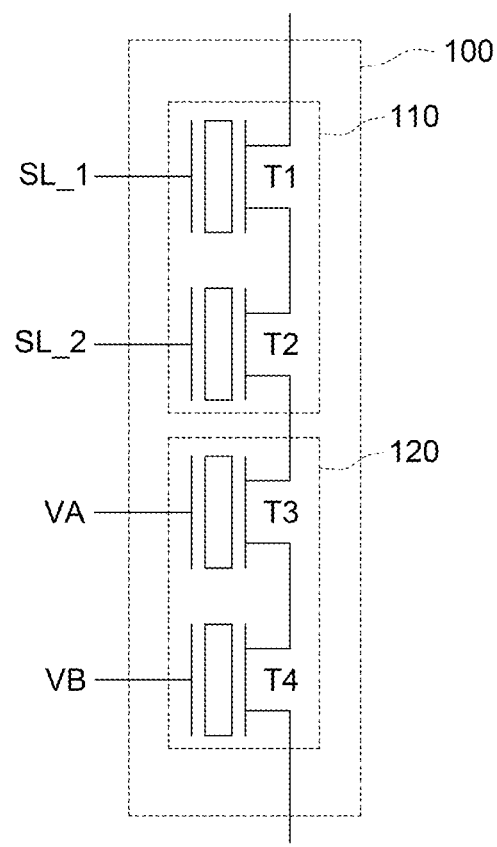
FIG. 1 shows a hybrid IMS CAM cell according to one embodiment of the application.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

FIG. 1 shows a hybrid IMS CAM cell according to one embodiment of the application. As shown in FIG. 1, the hybrid IMS CAM cell 100 includes a single level cell (SLC) IMAS CAM cell 110 and an analog IMS CAM cell 120.

In one embodiment of the application, the hybrid IMS CAM cell provides high array density, high accuracy and acceptable stability. For example but not limited by, as shown in FIG. 1, the hybrid IMS CAM cell 100 includes the SLC IMAS CAM cell 110 and the analog IMS CAM cell 120. The SLC IMAS CAM cell 110 has high system stability for coarse-matching. The analog IMS CAM cell 120 is for analog value comparison to improve accuracy as fine-matching.

The SLC IMAS CAM cell 110 includes serially-coupled flash memory cells T1 and T2; and the analog IMS CAM cell 120 includes serially-coupled flash memory cells T3 and T4. The flash memory cells T1-T4 are for example but not limited by, floating gate memory cells, Silicon-Oxide-Nitride-Oxide-Silicon (SONOS) memory cells, floating dot memory cells, Ferroelectric FET (FeFET) memory cells, Resistive Random Access Memory (RRAM) cells, phase-change memory cells, and conductive-bridging RAM (CBRAM) etc.

The gate of the flash memory cell T1 is configured to receive a first search voltage SL_1. The gate of the flash memory cell T2 is configured to receive a second search voltage SL_2. The source of the flash memory cell T1 is electrically connected to the source of the flash memory cell T2. The drain of the flash memory cell T1 is electrically connected to other signal line (not shown), and the drain of the flash memory cell T2 is electrically connected to the drain of the flash memory cell T3 of the analog IMS CAM cell 120.

The gate of the flash memory cell T3 is configured to receive a third search voltage VA. The gate of the flash memory cell T4 is configured to receive a fourth search voltage VB. The source of the flash memory cell T3 is electrically connected to the source of the flash memory cell T4. The drain of the flash memory cell T3 is electrically connected to the drain of the flash memory cell T2, and the drain of the flash memory cell T4 is electrically connected to other signal line (not shown).

Details of the SLC IMAS CAM cell 110 and the analog IMS CAM cell 120 are described.

Storage data of the SLC IMAS CAM cell 110 is determined based on a combination of a plurality of threshold voltages of the flash memory cell T1 and the flash memory cell T2.

Figure 2A:
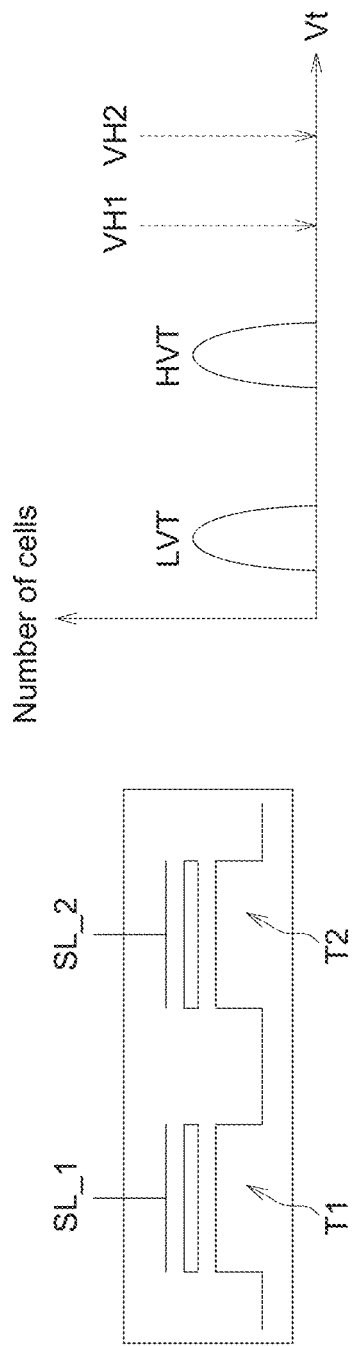
FIG. 2A shows a relationship between the threshold voltage (Vt) and the number of the cells according to one embodiment of the application.
Figure 2B:
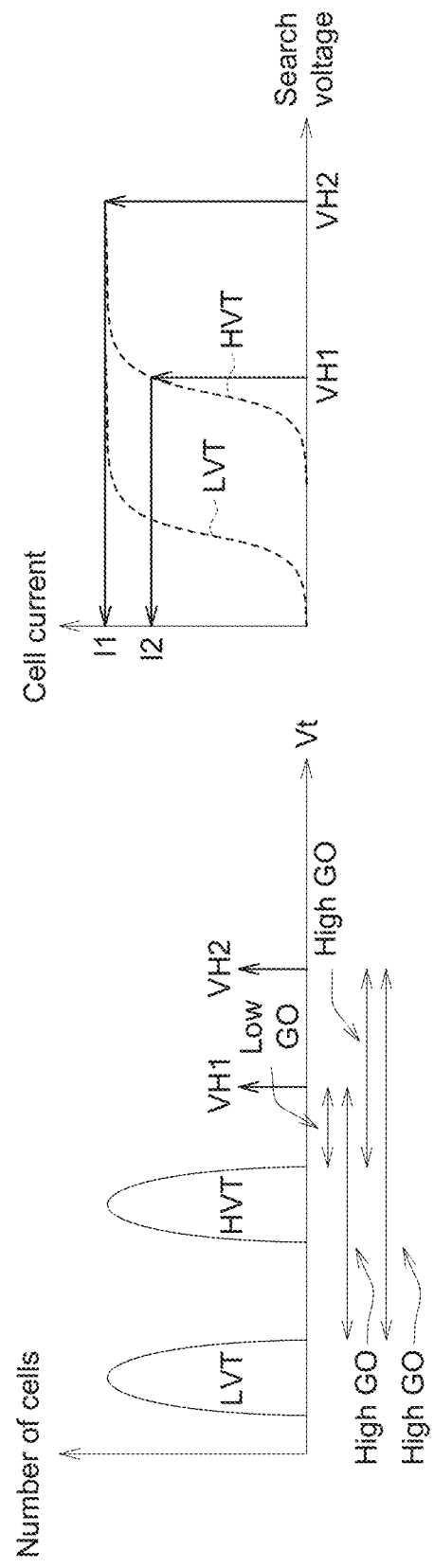
FIG. 2B shows a relationship diagram between the search voltage (SL_1, SL_2) and the cell current in the embodiment of the application.

FIG. 2A shows a relationship between the threshold voltage (Vt) and the number of the cells according to one embodiment of the application. FIG. 2B shows a relationship diagram between the search voltage (SL_1, SL_2) and the cell current in the embodiment of the application.

As shown in FIG. 2A, in the embodiment of the application, a high threshold voltage HVT is for example but not limited by, 3~4V while a low threshold voltage LVT is for example but not limited by, lower than 0V. Further, the reference search voltages VH1 and VH2 refers to the possible values of the first search voltage SL_1 and/or the second search voltage SL_2. For example but not limited by, the reference search voltages VH1 and VH2 may be 5V and 8V, respectively, i.e. VH1 is smaller than VH2.

Moreover, in the embodiment of the present application, the threshold voltage of the flash memory cell T1 (also referred as the first threshold voltage); the threshold voltage of the flash memory cell T2 (also referred as the second threshold voltage), the first search voltage SL_1 and the second search voltage SL_2 may be set as follows. The search data is decoded into the first search voltage SL_1 and the second search voltage SL_2.

| Storage data of the SLC IMAS CAM cell 110 | 1 | 0 | X (don't care) | Invalid data |
|---|---|---|---|---|
| the first threshold voltage | HVT | LVT | HVT | LVT |
| the second threshold voltage | LVT | HVT | HVT | LVT |

| Storage data of the SLC IMAS CAM cell 110 | 1 | 0 | Wildcard (WC) | Invalid data |
|---|---|---|---|---|
| the first search voltage SL_1 | VH1 | VH2 | VH2 | VH1 |
| the second search voltage SL_2 | VH2 | VH1 | VH2 | VH1 |

In the embodiment of the present application, when the storage data is a first predetermined storage data (1), the first threshold voltage is the high threshold voltage HVT and the second threshold voltage is the low threshold voltage LVT; when the storage data is a second predetermined storage data (0), the first threshold voltage is the low threshold voltage LVT and the second threshold voltage is the high threshold voltage HVT; when the storage data is a third predetermined storage data (X (don't care)), the first threshold voltage and the second threshold voltage are both the high threshold voltage HVT; and when the storage data is a fourth predetermined storage data (that is, invalid data), the first threshold voltage and the second threshold voltage are both the low threshold voltage LVT. That is, in the embodiment of the present application, the storage data of the SLC IMAS CAM cell 110 is based on a combination of the first threshold voltage of the flash memory cell T1 and the second threshold voltage of the flash memory cell T2.

In the embodiment of the present application, when the search data is a first predetermined search data (0), the first search voltage SL_1 is the first reference search voltage VH1 and the second search voltage SL_2 is the second reference search voltage VH2, wherein the search data represents data to be searched; when the search data is a second predetermined search data (0), the first search voltage SL_1 is the second reference search voltage VH2 and the second search voltage SL_2 is the first reference search voltage VH1; when the search data is a third predetermined search data (WC), the first search voltage SL_1 and the second search voltage SL_2 are both the second reference search voltage VH2; and when the search data is a fourth predetermined search data (invalid search), the first search voltage SL_1 and the second search voltage SL_2 are both the first reference search voltage VH1, wherein the first reference search voltage VH1 is lower than the second reference search voltage VH2.

As shown in FIG. 2B, in the embodiment, the voltage difference between the search voltage (applied to the word line) and the threshold voltage is referred as a gate overdrive voltage (GO). In a matched state, the gate overdrive voltage is higher than a threshold value and the flash memory cell T1/T2 provides a high cell current; and in a mismatched state, the gate overdrive voltage is lower than the threshold value and the flash memory cell T1/T2 provides a low cell current. Taking FIG. 2B as an example, the reference search voltages VH1 and VH2 may be 5V and 8V, respectively, the high reference threshold voltage HVT is for example but not limited by 3~4V while the low threshold voltage LVT is for example but not limited by, lower than 0V. The gate overdrive voltage between the reference search voltage VH2 (8V) and the high reference threshold voltage HVT (3~4V) is about 4~5V, which is a high gate overdrive voltage; the gate overdrive voltage between the reference search voltage VH2 (8V) and the low threshold voltage LVT (lower than 0V) is about higher than 8V, which is a high gate overdrive voltage; the gate overdrive voltage between the reference search voltage VH1 (5V) and the high reference threshold voltage HVT (3~4V) is about 1~2V, which is a low gate overdrive voltage; the gate overdrive voltage between the reference search voltage VH1 (5V) and the low threshold voltage LVT (lower than 0V) is about higher than 5V, which is a high gate overdrive voltage.

In details, when the search voltage is the second reference search voltage VH2, no matter the threshold voltage of the flash memory cell T1/T2 is either the low threshold voltage LVT or the high threshold voltage HVT, the gate overdrive voltage of the flash memory cell T1/T2 is higher than the threshold value and thus the flash memory cell T1/T2 provides a high reference cell current (I1). In the case that the search voltage is the first reference search voltage VH1, (1) when the threshold voltage of the flash memory cell T1/T2 is the low threshold voltage LVT, the gate overdrive voltage of the flash memory cell T1/T2 is higher than the threshold value and thus the flash memory cell T1/T2 provides the high reference cell current (I1); and (2) when the threshold voltage of the flash memory cell T1/T2 is the high threshold voltage HVT, the gate overdrive voltage of the flash memory cell T1/T2 is lower than the threshold value and thus the flash memory cell T1/T2 provides the low reference cell current (I2).

In one example, for example but not limited by, when the high threshold voltage HVT is 3~4V, the low threshold voltage LVT is lower than 0V, the reference search voltages VH1 and VH2 may be 5V and 8V, respectively, the high reference cell current (I1) and the low reference cell current (I2) are 100~500 nA and 1~99 nA, respectively.

In one embodiment, the match state between the search data and the storage data of the SLC IMAS CAM cell 110 is as follows.

| cell 110 | Search data 1 | Search data 0 | WC | Invalid search |
|---|---|---|---|---|
| Storage data 0 | T1: X<br>T2: ○<br>Mismatch (low reference cell current) | T1: ○<br>T2: ○<br>Match (high reference cell current) | T1: ○<br>T2: ○<br>Match (high reference cell current) | T1: X<br>T2: ○<br>Mismatch (low reference cell current) |
| Storage data 1 | T1: ○<br>T2: ○<br>Match (high reference cell current) | T1: ○<br>T2: X<br>Mismatch (low reference cell current) | T1: ○<br>T2: ○<br>Match (high reference cell current) | T1: ○<br>T2: X<br>Mismatch (low reference cell current) |
| Storage data X | T1: ○<br>T2: ○<br>Match (high reference cell current) | T1: ○<br>T2: ○<br>Match (high reference cell current) | T1: ○<br>T2: ○<br>Match (high reference cell current) | T1: ○<br>T2: ○<br>Match (high reference cell current) |
| Invalid data | T1: X<br>T2: ○<br>Mismatch (low reference cell current) | T1: ○<br>T2: X<br>Mismatch (low reference cell current) | T1: ○<br>T2: ○<br>Match (high reference cell current) | T1: X<br>T2: X<br>Mismatch (low reference cell current) |

X: non-conduct (low gate overdrive voltage)
○: conduct (high gate overdrive voltage)

Thus, when the search data is logic 1 while the storage data is logic 0, the flash memory cell T1 is not conducted while the flash memory cell T2 is conducted, and the cell current of the SLC IMAS CAM cell 110 is the low reference cell current (I2), which means the search result is mismatched. When the search data is logic 0 while the storage data is logic 0, the flash memory cell T1 and the flash memory cell T2 are both conducted, and the cell current of the SLC IMAS CAM cell 110 is the high reference cell current (I1), which means the search result is matched.

In searching the SLC IMAS CAM cell 110, when the search data is matched with the storage data, the cell current of the SLC IMAS CAM cell 110 is the high reference cell current (I1), which means the search result is matched. When the search data is mismatched with the storage data, the cell current of the SLC IMAS CAM cell 110 is the low reference cell current (I2), which means the search result is mismatched.

When the search data is wildcard (WC), no matter what value of the storage data is, the cell current of the SLC IMAS CAM cell 110 is the high reference cell current (I1), which means the search result is matched. When the search data is invalid search, no matter the storage data is logic 1 or logic 0 or invalid data, the cell current of the SLC IMAS CAM cell 110 is the low reference cell current (I2), which means the search result is mismatched.

When the storage data is X (don't care), no matter what value of the search data is, the cell current of the SLC IMAS CAM cell 110 is the high reference cell current (I1), which means the search result is matched. When the storage data is invalid data, no matter the search data is logic 1, logic 0 or invalid search, the cell current of the SLC IMAS CAM cell 110 is the low reference cell current (I2), which means the search result is mismatched.

Details of the analog IMS CAM cell 120 are described. Analog search data is for searching analog storage data stored in the analog IMS CAM cell 120. By adjusting the threshold voltages of the flash memory cells T3 and T4 of the analog IMS CAM cell 120, different match ranges are created. The third search voltage (which is an analog search voltage) VA and the fourth search voltage (which is also an analog search voltage) VB are input into the flash memory cells T3 and T4 via different word lines.

Figure 3A:
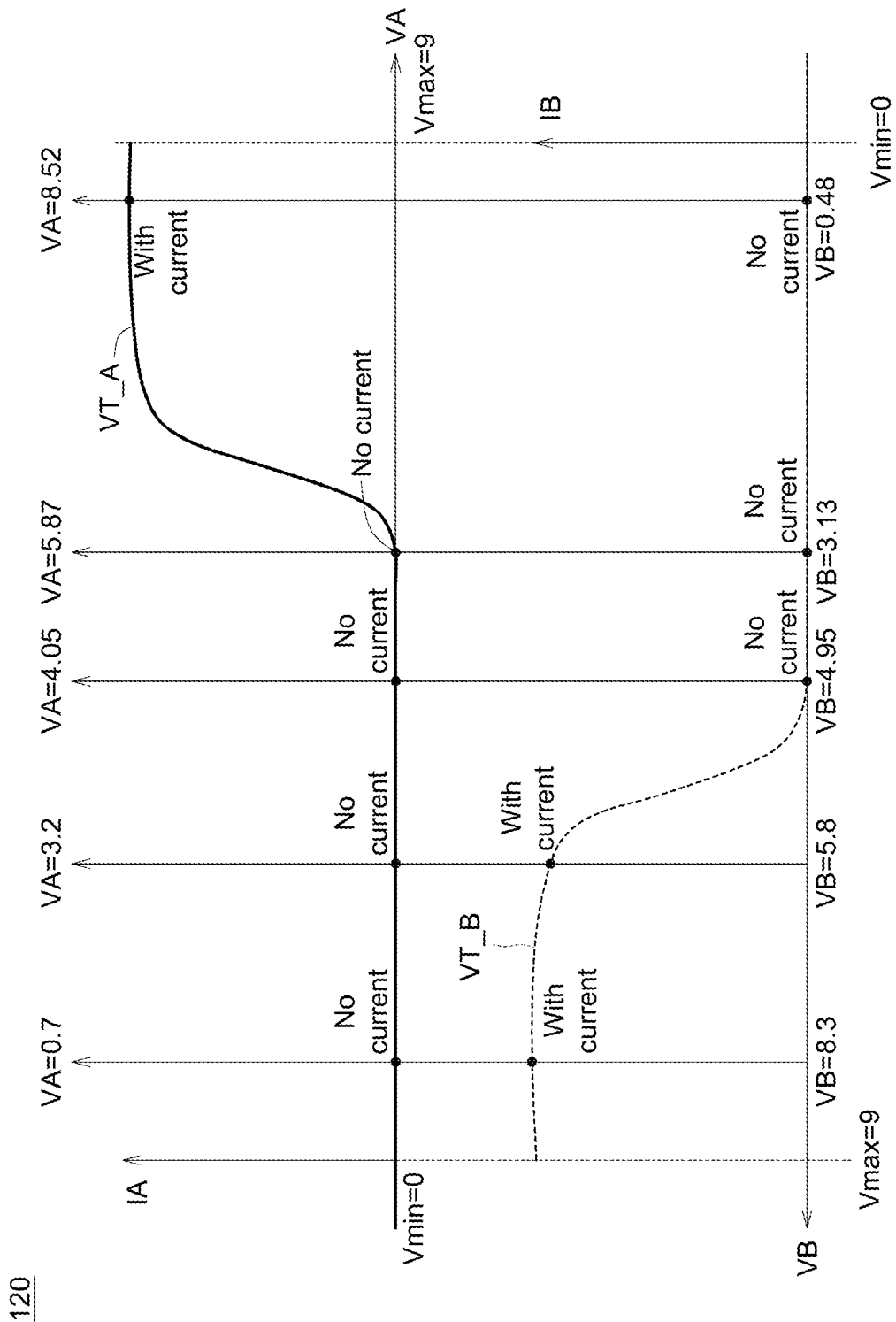
FIG. 3A shows a voltage-current curve of the analog IMS CAM cell according to one embodiment of the application.

FIG. 3A shows a voltage-current curve of the analog IMS CAM cell 120 according to one embodiment of the application. In FIG. 3A, the threshold voltage of the flash memory cell T3 is marked as VT_A (or referred as the third threshold voltage); and the threshold voltage of the flash memory cell T4 is marked as VT_B (or referred as the fourth threshold voltage). The threshold voltages VT_A and VT_B are independently programmed to arbitrary threshold voltage values if needed.

The channel current IA refers to the channel current flowing through the flash memory cell T3. The channel current IB refers to the channel current flowing through the flash memory cell T4.

In one embodiment of the application, the third search voltage VA and the fourth analog search voltage VB has a relationship for example but not limited by: VB=Vmax+Vmin−VA. Vmax and Vmin refer to an analog search voltage maximum value and an analog search voltage minimum value, respectively, which are both constant values. For example but not limited by, Vmax=9V and Vmin=0V.

In one embodiment of the application, when the analog search voltage minimum value Vmin is higher than or equal to 0V, both the third search voltage VA and the fourth search voltage VB are positive; when the analog search voltage maximum value Vmax is lower than or equal to 0V, both the third search voltage VA and the fourth search voltage VB are negative; and when the analog search voltage maximum value Vmax is higher than 0V and the analog search voltage minimum value Vmin is lower than 0V, one of the third search voltage VA and the fourth search voltage VB is positive while the other of the third search voltage VA and the fourth search voltage VB is negative.

As shown in FIG. 3A, when VA=0.7V and VB=8.3V, the flash memory cell T3 does not provide the memory cell current but the flash memory cell T4 provides the memory cell current. When VA=4.05V and VB=4.95V, neither the flash memory cell T3 nor the flash memory cell T4 provides the memory cell current. When VA=8.52V and VB=0.48V, the flash memory cell T3 provides the memory cell current but the flash memory cell T4 does not provide the memory cell current.

Figure 3B:
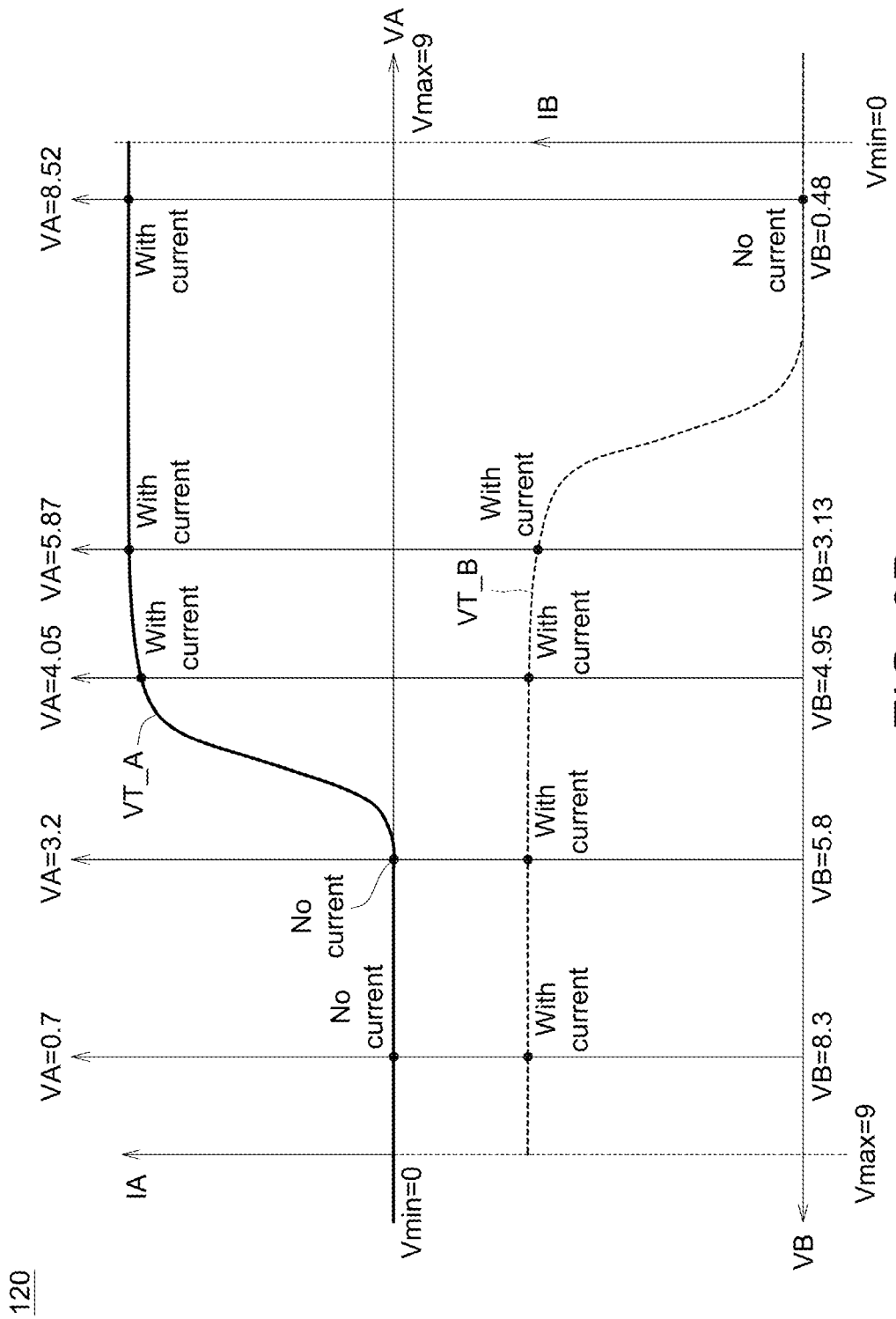
FIG. 3B shows another voltage-current curve of the analog IMS CAM cell according to one embodiment of the application.

FIG. 3B shows another voltage-current curve of the analog IMS CAM cell 120 according to one embodiment of the application. The threshold voltages VT_A and VT_B in FIG. 3B are lower than the threshold voltages VT_A and VT_B in FIG. 3A.

As shown in FIG. 3B, when VA=0.7V and VB=8.3V, neither the flash memory cell T3 nor the flash memory cell T4 provides the memory cell current. When VA=4.05V and VB=4.95V, both the flash memory cell T3 and the flash memory cell T4 provide the memory cell current. When VA=8.52V and VB=0.48V, the flash memory cell T3 provides the memory cell current but the flash memory cell T4 does not provide the memory cell current.

Figure 4:
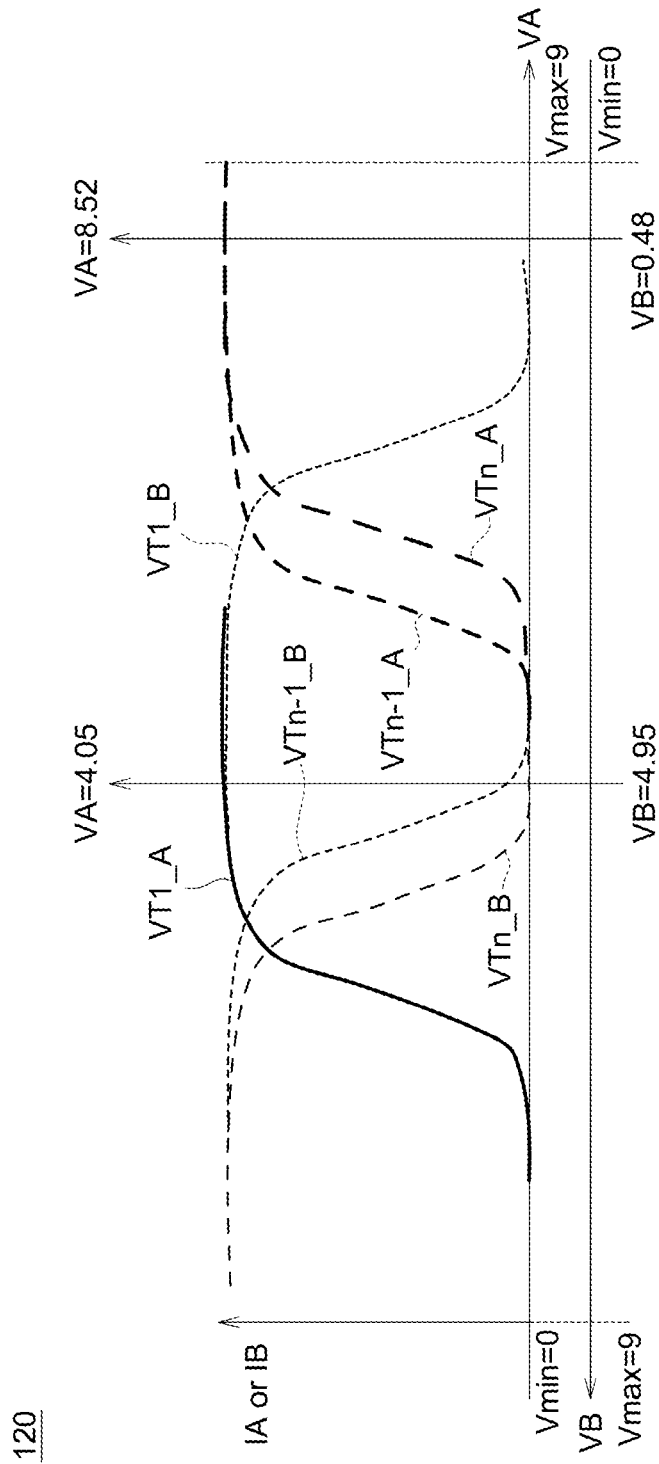
FIG. 4 shows a match range of the analog IMS CAM cell according to one embodiment of the application.

FIG. 4 shows a match range according to one embodiment of the application. In one embodiment of the application, the match range is determined based on the voltage-current relationship (i.e. the voltage-current curve) of the flash memory cell T3 and the voltage-current relationship (i.e. the voltage-current curve) of the flash memory cell T4. In one embodiment of the application, the match range is corresponding to the analog storage data of the analog IMS CAM cell 120. For example but not limited by, the analog storage data of the analog IMS CAM cell 120 is converted into the match range. The match range is determined based on the third threshold voltage of the flash memory cell T3 and the fourth threshold voltage of the flash memory cell T4 of the analog IMS CAM cell 120.

The analog storage data D has an analog storage data range between an analog storage data minimum Dmin and an analog storage data maximum Dmax. For example but not limited by, in one embodiment of the application, the analog storage data D of the analog IMS CAM cell 120 is between 0.00 (Dmin)~1.00 (Dmax). In one embodiment of the application, via encoding, the analog storage data minimum Dmin and the analog storage data maximum Dmax are encoded into the threshold voltage minimum VTmin and the threshold voltage maximum VTmax, respectively. That is, the threshold voltage minimum VTmin and the threshold voltage maximum VTmax are determined based on the analog storage data minimum Dmin and the analog storage data maximum Dmax. The threshold voltages of the flash memory cells T3 and T4 are between the threshold voltage minimum VTmin and the threshold voltage maximum VTmax.

Further, the analog search data S has an analog search data range between the analog search data minimum Smin and the analog search data maximum Smax. For example but not limited by, in one embodiment of the application, the analog search data S which may be used in searching the analog IMS CAM cell 120 are between 0.00 (Smin)~1.00 (Smax). In one embodiment of the application, by encoding, the analog search data minimum Smin and the analog search data maximum Smax are encoded into the analog search voltage minimum Vmin and the analog search voltage maximum Vmax, respectively. After encoding, the analog search data S is converted into the third search voltage VA and the fourth search voltage VB. The third search voltage VA and the fourth search voltage VB are continuous values. The third search voltage VA is between the analog search voltage minimum Vmin and the analog search voltage maximum Vmax and VB=Vmax+Vmin−VA.

In FIG. 4, the voltage-current curves are corresponding to the threshold voltages VT1_A~VTn_A and VT1_B~VTn_B. VT1_A~VTn_A indicate different n threshold voltages of the flash memory cell T3 (n being a positive integer); and VT1_B~VTn_B indicate different n threshold voltages of the flash memory cell T4. Wherein, VT1_A<VT2_A< . . . <VTn_A and VT1_B<VT2_B< . . . <VTn_B.

The match range is determined based on the voltage-current relationship (i.e. the voltage-current curve) of the flash memory cell T3 and the voltage-current relationship (i.e. the voltage-current curve) of the flash memory cell T4. For example but not limited by, when the flash memory cells T3 and T4 have threshold voltages of VT1_A and VT1_B, a match range is determined; and when the flash memory cells T3 and T4 have threshold voltages of VT2_A and VT1_B, another match range is determined.

Figure 5A:
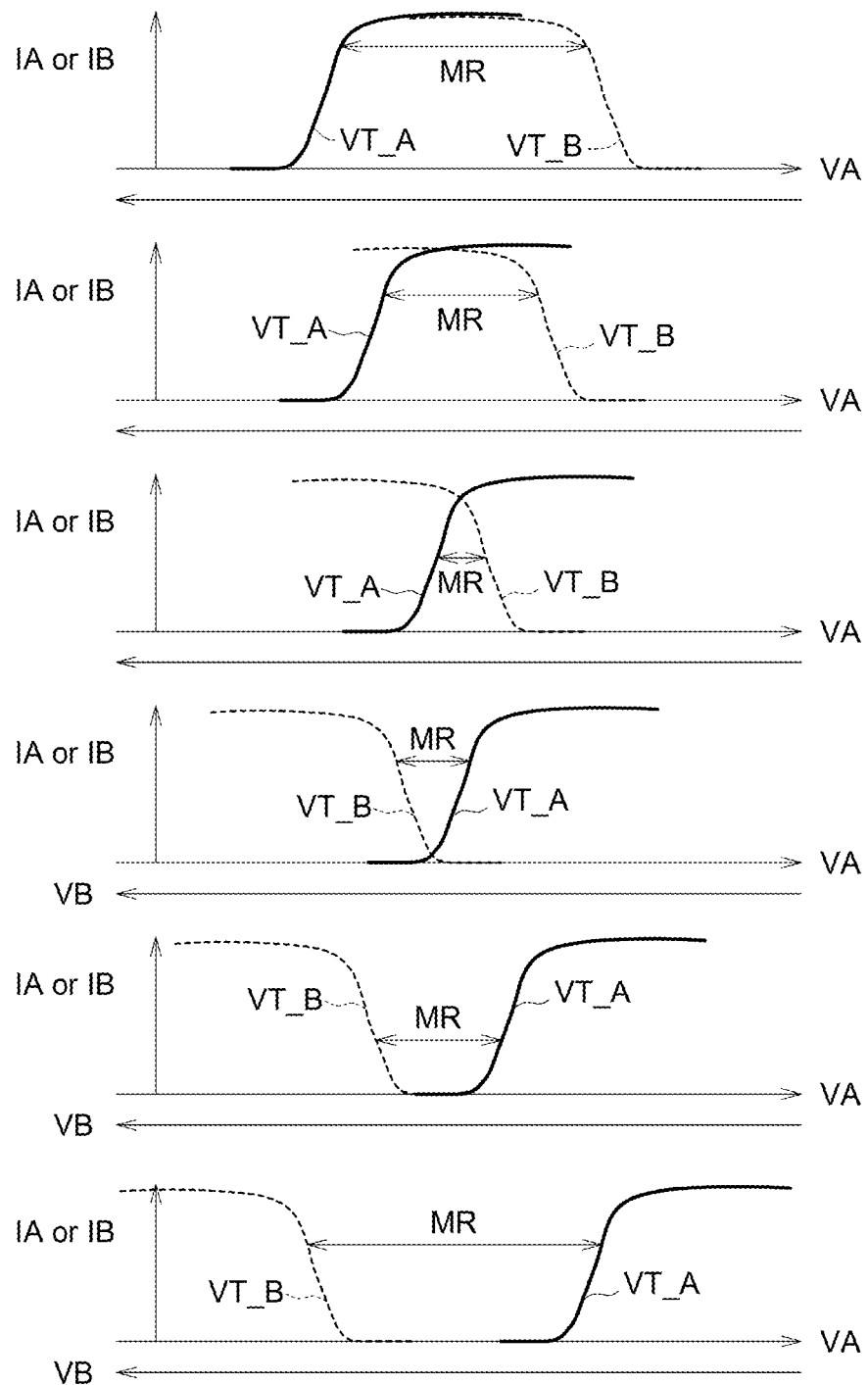
FIG. 5A to FIG. 5C show match ranges of the analog IMS CAM cell according to one embodiment of the application.
Figure 5B:
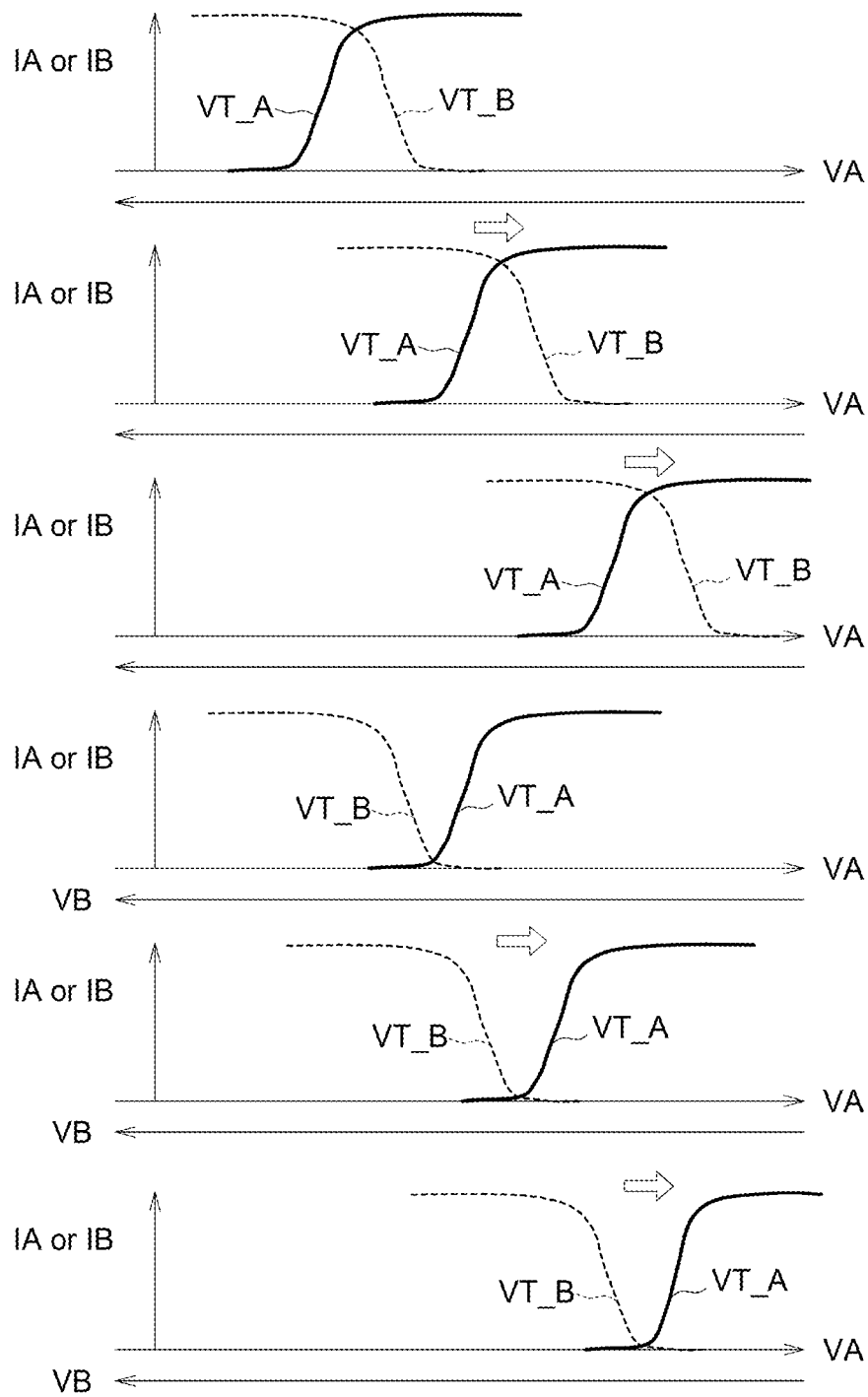
Figure 5C:
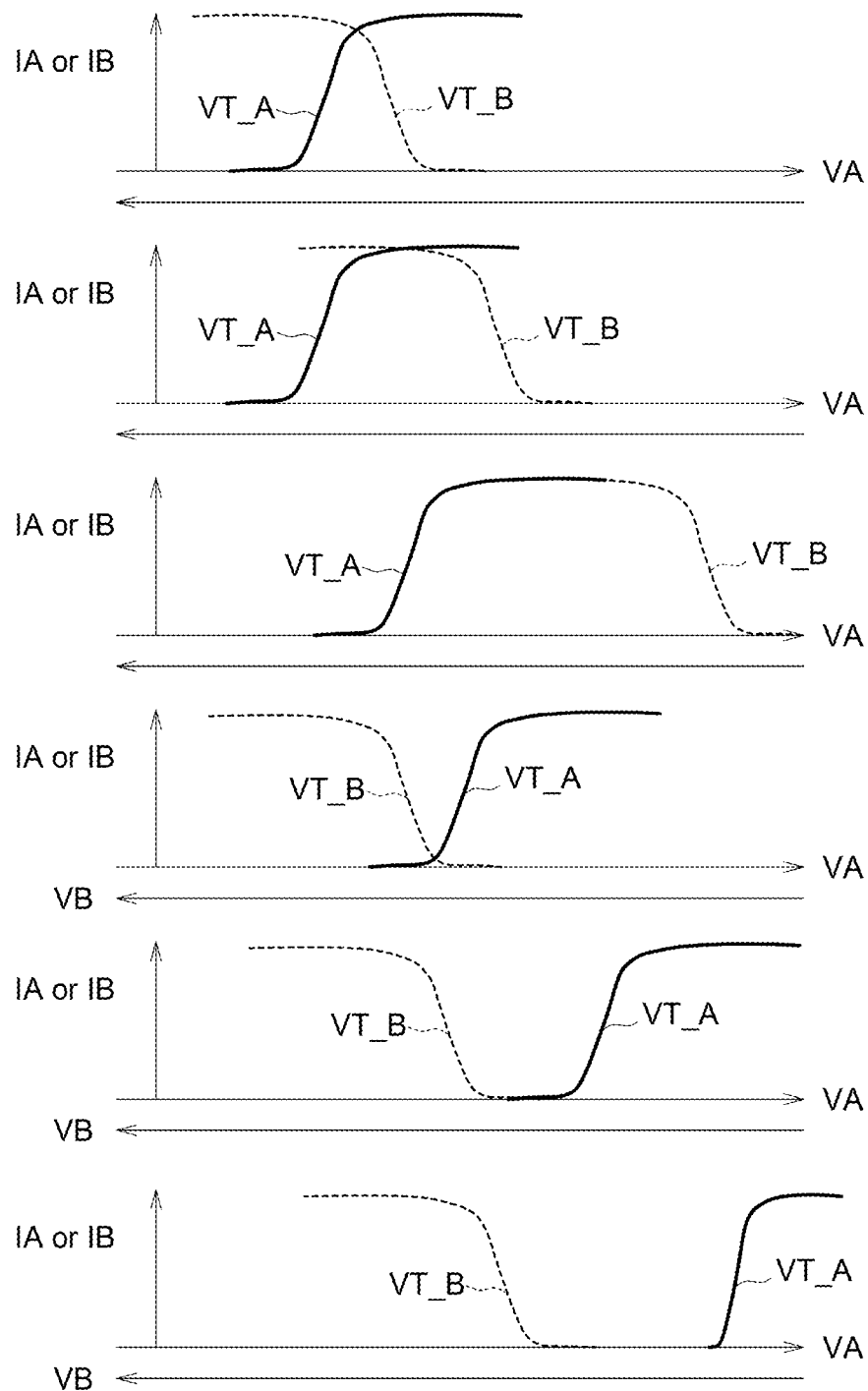

FIG. 5A to FIG. 5C show match ranges of the analog IMS CAM cell 120 according to one embodiment of the application. In one embodiment of the application, for example but not limited by, the match range is between 1.5V~2.5V. The range width of the match range is 2.5V-1.5V=1V; and the maximum value and the minimum value of the match rage are 2.5V and 1.5V. The maximum value and the minimum value of the match rage are also referred as a position of the match range.

As shown in FIG. 5A, by changing the threshold voltages VT_A and VT_B of the flash memory cells T3 and T4, the range width of the match range is changed. The definition of the match range MR is described later.

As shown in FIG. 5B, by changing the threshold voltages VT_A and VT_B of the flash memory cells T3 and T4, the maximum value and the minimum value (i.e. the position) of the match range MR are changed.

As shown in FIG. 5C, by changing the threshold voltages VT_A and VT_B of the flash memory cells T3 and T4, the range width, the maximum value and the minimum value (i.e. the position) of the match range are changed.

That is, in one embodiment of the application, by changing the threshold voltages VT_A and VT_B of the flash memory cells T3 and T4, the range width and/or the position of the match range are changed.

FIG. 6A and FIG. 6B show the match current of the analog IMS CAM cell 120 according one embodiment of the application. In one embodiment of the application, by changing the threshold voltages VT_A and VT_B of the flash memory cells T3 and T4, the match current of the analog IMS CAM cell 120 is also changed. Here, the match current refers to the current from the analog IMS CAM cell 120 when the analog search voltage matches with the match range.

As shown in FIG. 6A, when the threshold voltage of the flash memory cell T4 is VT1_B~VT6_B (VT1_B<VT2_B< . . . <VT6_B), the match currents are MC11~MC16, respectively, wherein MC11>MC12 . . . >MC16.

As shown in FIG. 6B, when the threshold voltage of the flash memory cell T3 is VT1_A~VT6_A (VT1_A<VT2_A< . . . <VT6_A), the match currents are MC21~MC26, respectively, wherein MC21>MC22 . . . >MC26.

That is, in one embodiment of the application, by changing the threshold voltages VT_A and VT_B of the flash memory cells T3 and T4, the match current of the analog IMS CAM cell 120 is adjusted.

Figure 7:
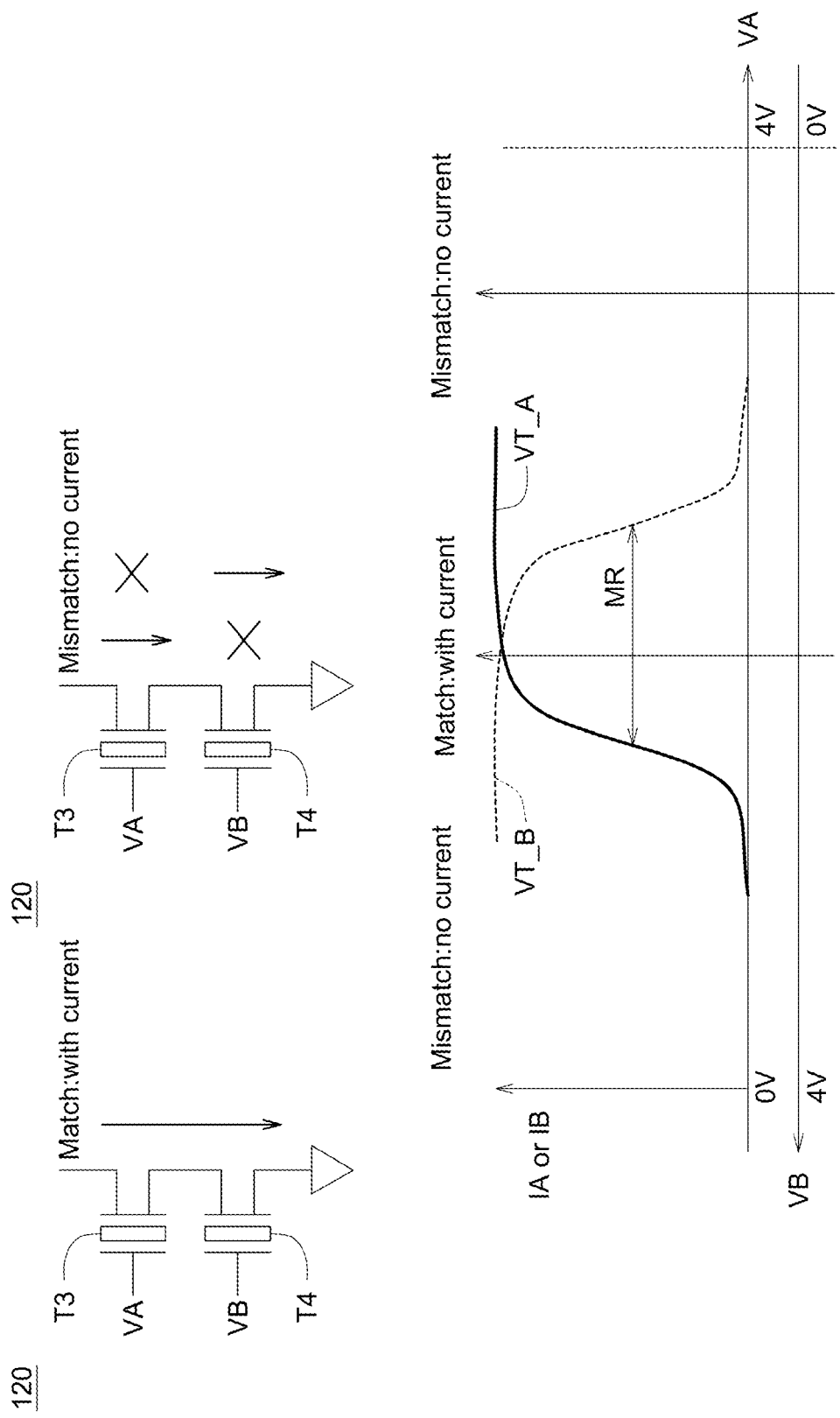
FIG. 7 shows a match range of the analog IMS CAM cell 120 according to one embodiment of the application.

FIG. 7 shows a match range of the analog IMS CAM cell 120 according to one embodiment of the application. As shown in FIG. 7, it is assumed that the maximum value and the minimum value of the third search voltage VA are 4V and 0V, respectively, then the fourth search voltage VB (VB=Vmax+Vmin−VA) is between 0V~4V. For example but not limited by, when the third search voltage VA and the fourth search voltage VB are 1.6V and 2.4V, respectively, from the voltage-current curve in FIG. 7, both the flash memory cells T3 and T4 generate the memory cell currents, which is determined as "match". Thus, the match range is defined as when both the flash memory cells T3 and T4 generate the memory cell currents.

When the third search voltage VA and the fourth search voltage VB are 3.7V and 0.3V, respectively, from the voltage-current curve in FIG. 7, the flash memory cell T3 generates the memory cell current but the flash memory cell T4 generates no any memory cell currents, which is determined as "mismatch". Alternatively, when the third search voltage VA and the fourth search voltage VB are 0.3V and 3.7V, respectively, from the voltage-current curve in FIG. 7, the flash memory cell T3 generates no any memory cell currents but the flash memory cell T4 generates the memory cell current, which is determined as "mismatch". Thus, when one of the flash memory cells T3 and T4 generates the memory cell current and the other one generates no any memory cell currents, which is defined as "mismatch".

That is, in one embodiment of the application, when the third search voltage VA falls within the match range, both of the flash memory cells T3 and T4 generate the memory cell currents and the analog IMS CAM cell 120 generates the match current. On the other hand, when the third search voltage VA falls outside the match range, one of the flash memory cells T3 and T4 generates the memory cell current while the other one of the flash memory cells T3 and T4 generates no any memory cell currents, and the analog IMS CAM cell 120 generates no any match currents.

As described above, in one embodiment of the application, based on whether the analog IMS CAM cell 120 generates the match current, it is determined the search result is matched or mismatched.

Data search on the hybrid IMS CAM cell 100 in one embodiment of the application is described.

Figure 8:
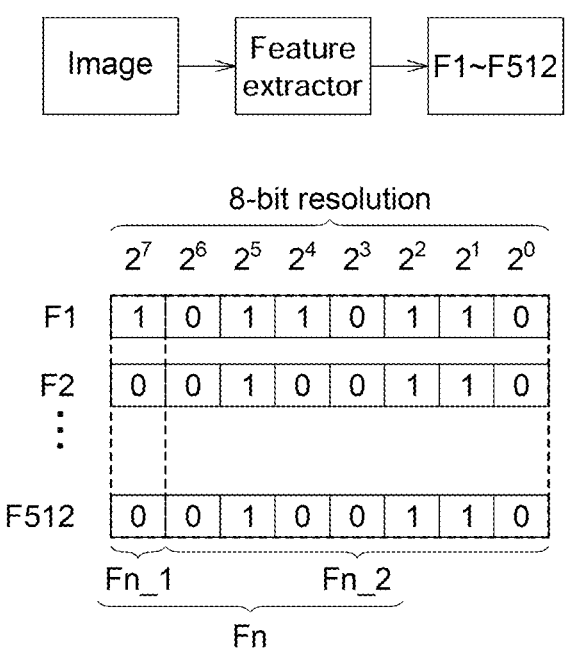
FIG. 8 shows feature extraction from images.

FIG. 8 shows feature extraction from images. As shown in FIG. 8, a feature extractor extracts from an image a plurality of features, for example but not limited by, 512 features F1~F512, each of the features is 8 bit resolution. The 512 features F1~F512 may be stored into 512 hybrid IMS CAM cells 100.

In data search, there are two implementations to store the feature Fn (n=1-512) into the hybrid IMS CAM cell 100, which are shown in FIG. 9A, FIG. 9B, FIG. 10A and FIG. 10B.

Figure 9A:
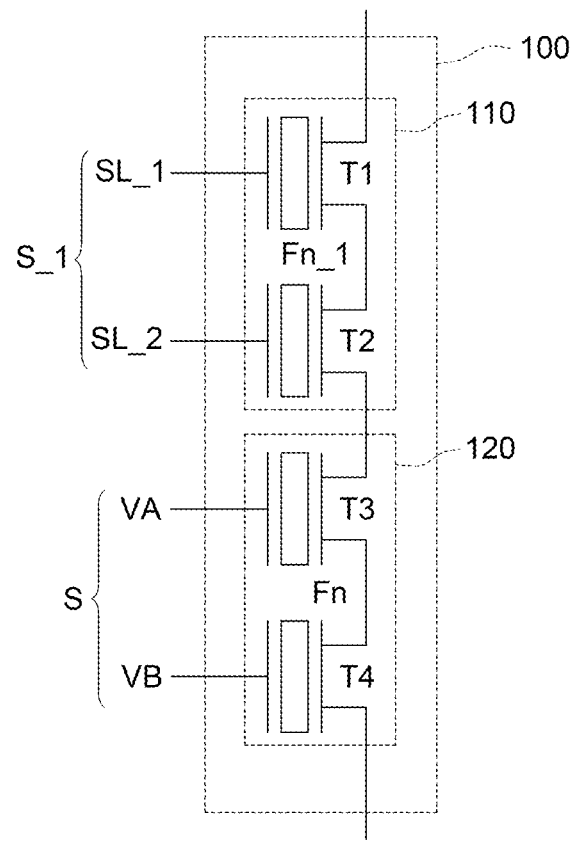
FIG. 9A and FIG. 9B show a first data storage and search method according to one embodiment of the application.
Figure 9B:
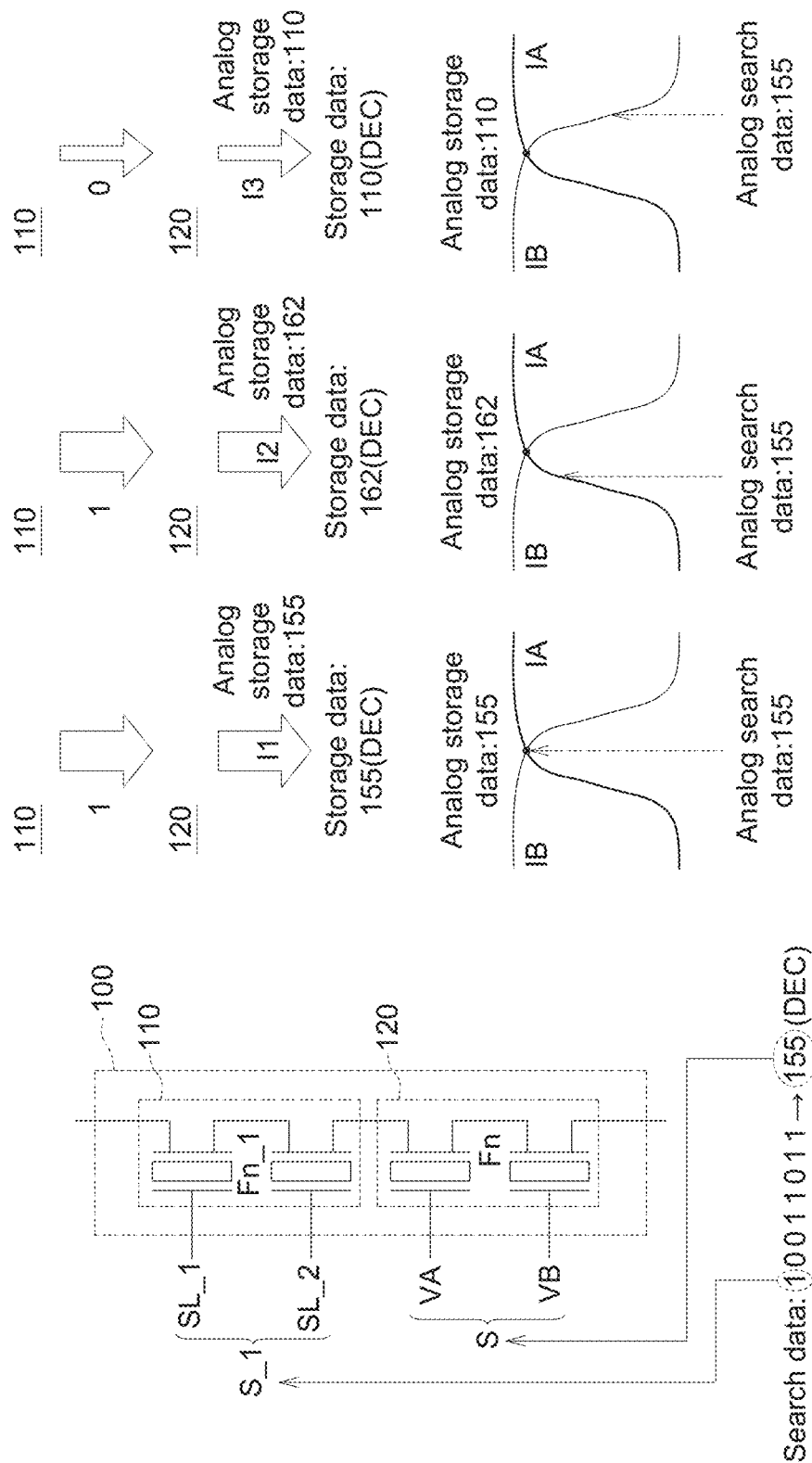
Figure 10A:
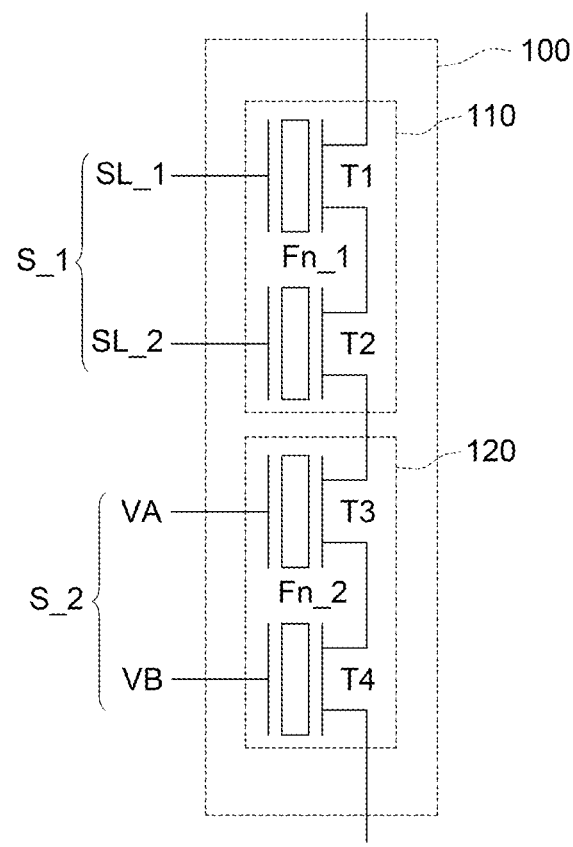
FIG. 10A and FIG. 10B show a second data storage and search method according to one embodiment of the application.
Figure 10B:
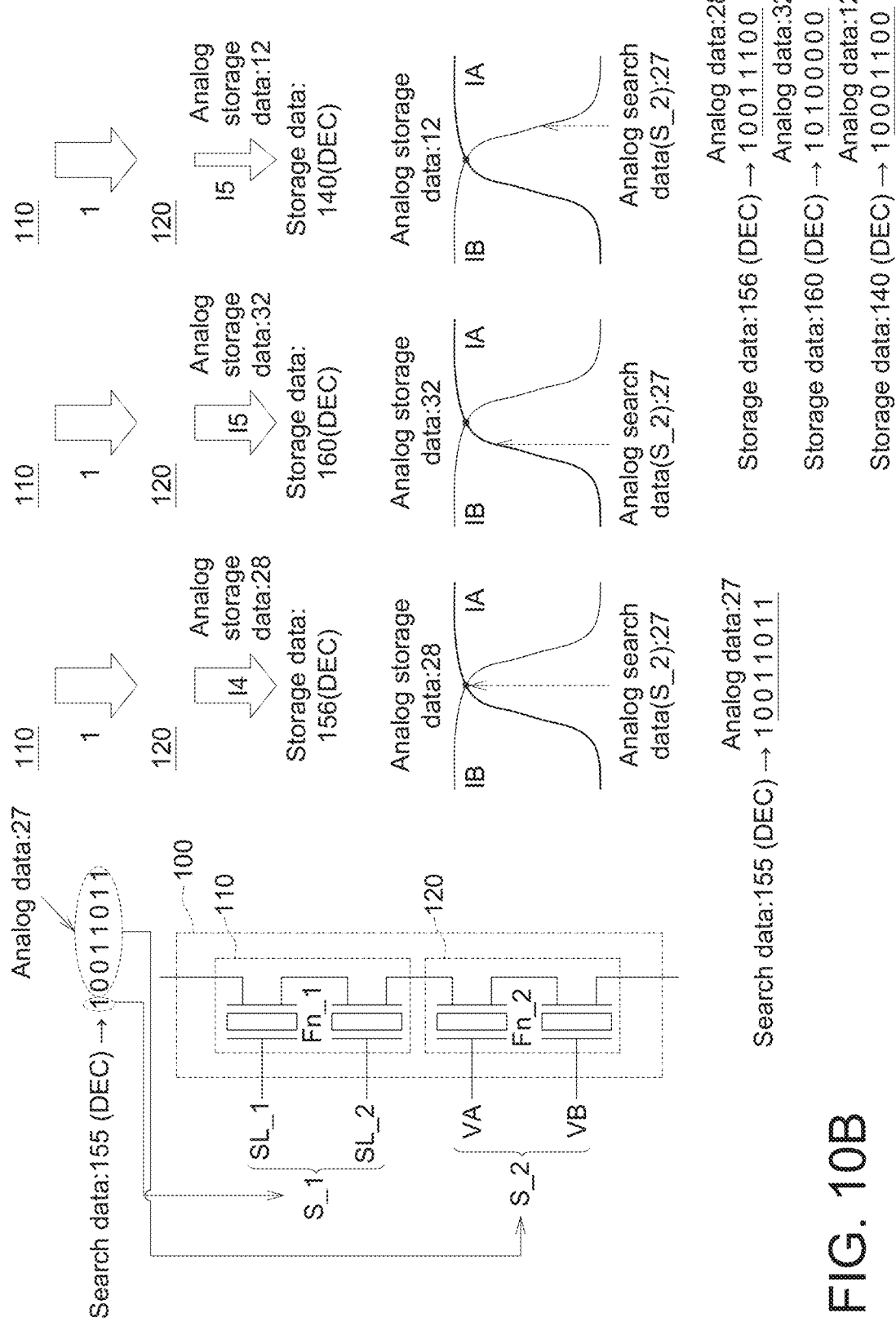

FIG. 9A and FIG. 9B show a first data storage and search method according to one embodiment of the application. FIG. 10A and FIG. 10B show a second data storage and search method according to one embodiment of the application.

As shown in FIG. 9A and FIG. 9B, in the first data storage and search method according to one embodiment of the application, when the feature Fn is stored into the hybrid IMS CAM cell 100, a first part Fn_1 of the feature Fn is stored in the SLC IMAS CAM cell 110; and the feature Fn is stored in the analog IMS CAM cell 120. For example but not limited by, the first part Fn_1 of the feature Fn is an MSB (most significant bit) of the feature Fn. In data search, a first part S_1 of the search data S is for searching the first part Fn_1 of the feature Fn stored in the SLC IMAS CAM cell 110; and the search data S is for searching the feature Fn stored in the analog IMS CAM cell 120. That is, in decimal bit system, for the feature having 8 bits, the feature Fn stored in the analog IMS CAM cell 120 is 0-255. In details, in data search, the first part S_1 of the search data S is decoded into the first search voltage SL_1 and the second search voltage SL_2 for searching the first part Fn_1 of the feature Fn stored in the SLC IMAS CAM cell 110; and the search data S is decoded into the third search voltage VA and the fourth search voltage VB for searching the feature Fn stored in the analog IMS CAM cell 120.

As shown in FIG. 10A and FIG. 10B, in the second data storage and search method according to one embodiment of the application, when the feature Fn is stored into the hybrid IMS CAM cell 100, a first part Fn_1 of the feature Fn is stored in the SLC IMAS CAM cell 110; and a second part Fn_2 of the feature Fn is stored in the analog IMS CAM cell 120. For example but not limited by, the first part Fn_1 of the feature Fn is an MSB (most significant bit) of the feature Fn; and the second part Fn_2 of the feature Fn is the other bits of the feature Fn, i.e. the second MSB to the LSB (least significant bit). In data search, a first part S_1 of the search data S is for searching the first part Fn_1 of the feature Fn stored in the SLC IMAS CAM cell 110; and a second part S_2 of the search data S is for searching the second part Fn_2 of the feature Fn stored in the analog IMS CAM cell 120. That is, in decimal bit system, for the feature having 8 bits, the first part Fn_1 stored in the SLC IMAS CAM cell 110 is 128-255 while the second part Fn_2 of the feature Fn stored in the analog IMS CAM cell 120 is 0-127. In details, in data search, the first part S_1 of the search data S is decoded into the first search voltage SL_1 and the second search voltage SL_2 for searching the first part Fn_1 of the feature Fn stored in the SLC IMAS CAM cell 110; and the second part S_2 of the search data S is decoded into the third search voltage VA and the fourth search voltage VB for searching the second part Fn_2 of the feature Fn stored in the analog IMS CAM cell 120.

Refer to FIG. 9A and FIG. 9B again. The search data S=10011011 is taken as an example, which is not to limit the application. When the search data S (10011011) is converted into decimal (DEC), the search data S is 155 (DEC). The first part S_1 of the search data S is logic 1 (MSB).

In FIG. 9B, when the storage data (the feature Fn) having a decimal value of 155 is stored in the hybrid IMS CAM cell 100, the first part Fn_1 of the feature Fn stored in the SLC IMAS CAM cell 110 is logic 1 (MSB) while the feature Fn stored in the analog IMS CAM cell 120 is 155 (DEC). In data search, the first part S_1 (logic 1 (MSB)) of the search data S is for searching the first part Fn_1 (logic 1 (MSB)) of the feature Fn stored in the SLC IMAS CAM cell 110 and the search result is matched, wherein the SLC IMAS CAM cell 110 generates high current. The search data S (155 (DEC)) is for searching the feature Fn (155 (DEC)) stored in the analog IMS CAM cell 120, wherein the analog IMS CAM cell 120 generates a current I1.

In FIG. 9B, when the storage data (the feature Fn) having a decimal value of 162 is stored in the hybrid IMS CAM cell 100, the first part Fn_1 of the feature Fn stored in the SLC IMAS CAM cell 110 is logic 1 (MSB) while the feature Fn stored in the analog IMS CAM cell 120 is 162 (DEC). In data search, the first part S_1 (logic 1 (MSB)) of the search data S is for searching the first part Fn_1 (logic 1 (MSB)) of the feature Fn stored in the SLC IMAS CAM cell 110 and the search result is matched, wherein the SLC IMAS CAM cell 110 generates high current. The search data S (155 (DEC)) is for searching the feature Fn (162(DEC)) stored in the analog IMS CAM cell 120, wherein the analog IMS CAM cell 120 generates a current I2.

In FIG. 9B, when the storage data (the feature Fn) having a decimal value of 110 is stored in the hybrid IMS CAM cell 100, the first part Fn_1 of the feature Fn stored in the SLC IMAS CAM cell 110 is logic 0 (MSB) while the feature Fn stored in the analog IMS CAM cell 120 is 110 (DEC). In data search, the first part S_1 (logic 1 (MSB)) of the search data S is for searching the first part Fn_1 (logic 0 (MSB)) of the feature Fn stored in the SLC IMAS CAM cell 110 and the search result is mismatched, wherein the SLC IMAS CAM cell 110 generates low current. The search data S (155 (DEC)) is for searching the feature Fn (110 (DEC)) stored in the analog IMS CAM cell 120, wherein the analog IMS CAM cell 120 generates a current I3. I1>I2>I3. That is, when the search data S is closer to the feature Fn stored in the analog IMS CAM cell 120, the analog IMS CAM cell 120 generates a higher current, while when the search data S is more away from the feature Fn stored in the analog IMS CAM cell 120, the analog IMS CAM cell 120 generates a lower current.

Refer to FIG. 10A and FIG. 10B again. The search data S=10011011 is taken as an example, which is not to limit the application. When the search data S (10011011) is converted into decimal (DEC), the search data S is 155 (DEC). The first part S_1 of the search data S is logic 1 (MSB) while the second part S_2 of the search data S is 0011011, which is converted into 27 (DEC) in decimal.

In FIG. 10B, when the storage data (the feature Fn) having a decimal value of 156 is stored in the hybrid IMS CAM cell 100, the first part Fn_1 of the feature Fn stored in the SLC IMAS CAM cell 110 is logic 1 (MSB) while the second part Fn_2 of the feature Fn stored in the analog IMS CAM cell 120 is 28 (DEC). In data search, the first part S_1 (logic 1 (MSB)) of the search data S is for searching the first part Fn_1 (logic 1 (MSB)) of the feature Fn stored in the SLC IMAS CAM cell 110 and the search result is matched, wherein the SLC IMAS CAM cell 110 generates high current. The second part S_2 (having a value of 27 (DEC)) of the search data S is for searching the second part Fn_2 (having a value of 28 (DEC)) of the feature Fn stored in the analog IMS CAM cell 120, wherein the analog IMS CAM cell 120 generates a current I4.

In FIG. 10B, when the storage data (the feature Fn) having a decimal value of 160 is stored in the hybrid IMS CAM cell 100, the first part Fn_1 of the feature Fn stored in the SLC IMAS CAM cell 110 is logic 1 (MSB) while the second part Fn_2 of the feature Fn stored in the analog IMS CAM cell 120 is 32 (DEC). In data search, the first part S_1 (logic 1 (MSB)) of the search data S is for searching the first part Fn_1 (logic 1 (MSB)) of the feature Fn stored in the SLC IMAS CAM cell 110 and the search result is matched, wherein the SLC IMAS CAM cell 110 generates high current. The second part S_2 (having a value of 27 (DEC)) of the search data S is for searching the second part Fn_2 (having a value of 32 (DEC)) of the feature Fn stored in the analog IMS CAM cell 120, wherein the analog IMS CAM cell 120 generates a current I5.

In FIG. 10B, when the storage data (the feature Fn) having a decimal value of 140 is stored in the hybrid IMS CAM cell 100, the first part Fn_1 of the feature Fn stored in the SLC IMAS CAM cell 110 is logic 1 (MSB) while the second part Fn_2 of the feature Fn stored in the analog IMS CAM cell 120 is 12 (DEC). In data search, the first part S_1 (logic 1 (MSB)) of the search data S is for searching the first part Fn_1 (logic 1 (MSB)) of the feature Fn stored in the SLC IMAS CAM cell 110 and the search result is matched, wherein the SLC IMAS CAM cell 110 generates high current. The second part S_2 (having a value of 27 (DEC)) of the search data S is for searching the second part Fn_2 (having a value of 12 (DEC)) of the feature Fn stored in the analog IMS CAM cell 120, wherein the analog IMS CAM cell 120 generates a current I6. I4>I5>I6. That is, when the second part S_2 of the search data S is closer to the second part Fn_2 of the feature Fn stored in the analog IMS CAM cell 120, the analog IMS CAM cell 120 generates a higher current, while when the second part S_2 of the search data S is more away from the second part Fn_2 of the feature Fn stored in the analog IMS CAM cell 120, the analog IMS CAM cell 120 generates a lower current.

Figure 11:
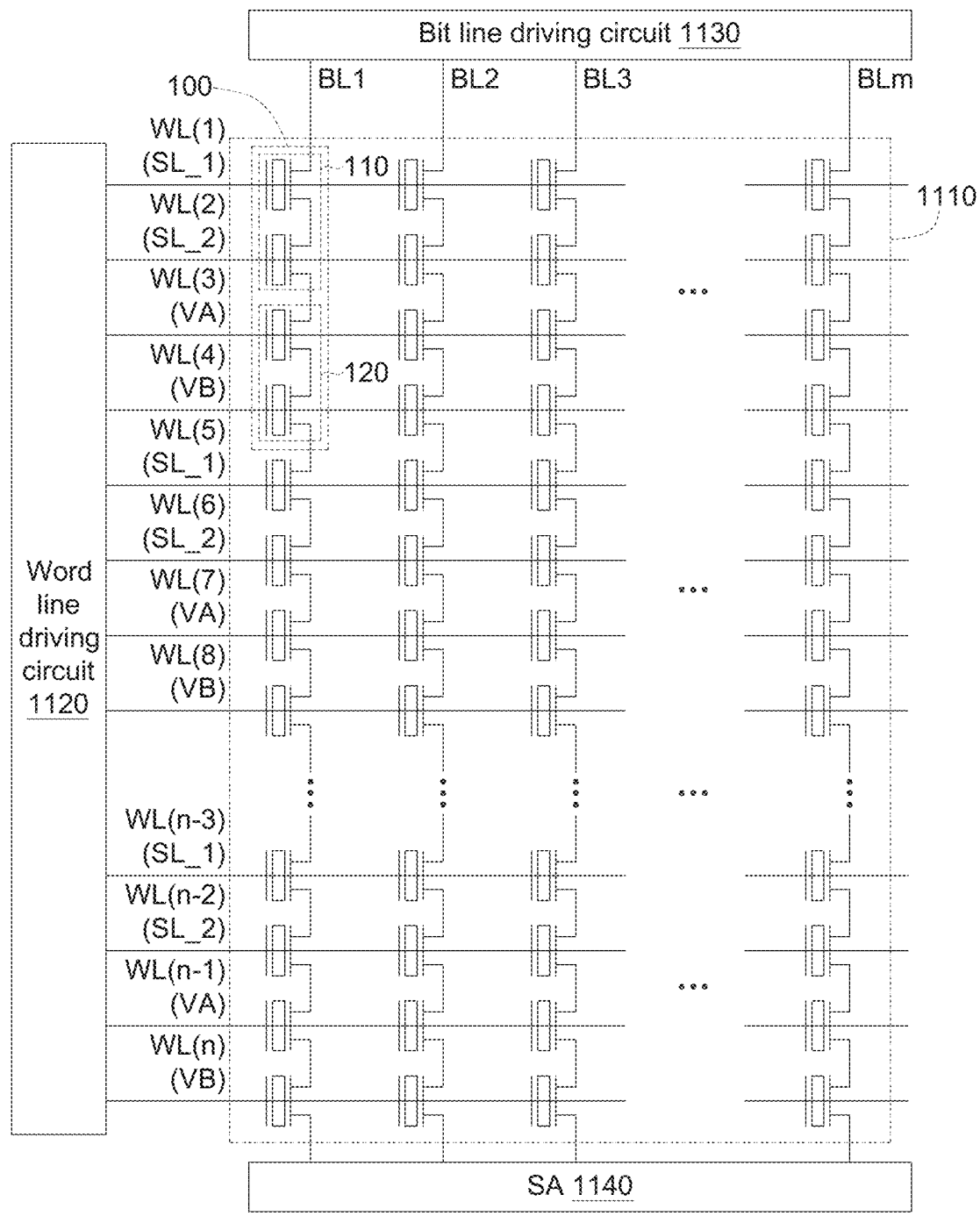
FIG. 11 shows a circuit diagram of a hybrid IMS CAM memory device according to one embodiment of the application.

FIG. 11 shows a circuit diagram of a hybrid IMS CAM memory device according to one embodiment of the application. As shown in FIG. 11, the hybrid IMS CAM memory device 1100 includes a hybrid IMS CAM memory array 1110, a word line driving circuit 1120, a bit line driving circuit 1130 and a sensing amplifier (SA) 1140.

The hybrid IMS CAM memory array 1110 includes a plurality of hybrid IMS CAM cells 100, a plurality of word lines WL1~WLn (n being a positive integer) and a plurality of bit lines BL1~BLm (m being a positive integer). The hybrid IMS CAM cells 100 are coupled to the word lines WL1~WLn and the bit lines BL1~BLm.

The word line driving circuit 1120 is coupled to the word lines WL1~WLn for, based on the search data S, applying the search voltages SL_1, SL_2, VA and VB to the hybrid IMS CAM cells 100 for searching the hybrid IMS CAM cells 100.

The bit line driving circuit 1130 is coupled to the bit lines BL1~BLm for applying bit line driving voltages to the bit lines BL1~BLm.

The sensing amplifier (SA) 1140 is coupled to the hybrid IMS CAM cells 100 for sensing a plurality of sensing currents from the hybrid IMS CAM cells 100 to decide whether the search data S is matched with the storage data stored in the hybrid IMS CAM cells 100.

FIG. 12A to FIG. 12D shows several different examples of the hybrid IMS CAM cell according to embodiments of the application.

In FIG. 12A, the hybrid IMS CAM cell 1200A includes a first IMS CAM cell 1210A and a second IMS CAM cell 1220A. The first IMS CAM cell 1210A is for example but not limited by, a single-level cell (SLC) IMS CAM cell. The second IMS CAM cell 1220A is for example but not limited by, a SLC IMAS CAM cell or a MLC (multi-level cell) IMS CAM cell or a MLC IMAS CAM cell or an analog IMS CAM cell.

In FIG. 12B, the hybrid IMS CAM cell 1200B includes a first IMS CAM cell 1210B and a second IMS CAM cell 1220B. The first IMS CAM cell 1210B is for example but not limited by, a SLC IMAS CAM cell. The second IMS CAM cell 1220B is for example but not limited by, a MLC IMS CAM cell or a MLC IMAS CAM cell or an analog IMS CAM cell.

In FIG. 12C, the hybrid IMS CAM cell 1200C includes a first IMS CAM cell 1210C and a second IMS CAM cell 1220C. The first IMS CAM cell 1210C is for example but not limited by, a MLC IMS CAM cell. The second IMS CAM cell 1220C is for example but not limited by, a MLC IMAS CAM cell or an analog IMS CAM cell.

In FIG. 12D, the hybrid IMS CAM cell 1200D includes a first IMS CAM cell 1210D and a second IMS CAM cell 1220D. The first IMS CAM cell 1210D is for example but not limited by, a MLC IMAS CAM cell. The second IMS CAM cell 1220D is for example but not limited by, an analog IMS CAM cell.

In brief, in one embodiment of the application, the hybrid IMS CAM cell includes a first IMS CAM cell and a second IMS CAM cell, wherein the first IMS CAM cell and the second IMS CAM cell are of different types. Definition of "different types" is as follows.

In one embodiment of the application, when the first IMS cell CAM and the second IMS CAM cell have different storage bit number, the first IMS CAM cell and the second IMS CAM cell are of different types. For example but not limited by, when the first IMS CAM cell is a SLC (having a single storage bit) while the second IMS CAM cell is a MLC (multi-level cell)(having two storage bits, three storage bits, four storage bits . . . ), the first IMS CAM cell and the second IMS CAM cell are of different types.

Alternatively, in one embodiment of the application, when one among the first IMS cell CAM and the second IMS CAM cell stores digital data while the other one among the first IMS cell CAM and the second IMS CAM cell stores analog data, the first IMS CAM cell and the second IMS CAM cell are of different types. For example but not limited by, when one among the first IMS cell CAM and the second IMS CAM cell is an analog IMS CAM cell (which stores analog data) while the other one among the first IMS cell CAM and the second IMS CAM cell is a digital IMS CAM cell (which stores digital data) or a digital IMAS CAM cell (which stores digital data), the first IMS CAM cell and the second IMS CAM cell are of different types. The digital IMS CAM cell is for example a SLC IMS CAM cell or a MLC IMS CAM cell. The digital IMAS CAM cell is for example a SLC IMAS CAM cell or a MLC IMAS CAM cell.

Alternatively, in one embodiment of the application, when one among the first IMS cell CAM and the second IMS CAM cell is an IMS CAM cell while the other one among the first IMS cell CAM and the second IMS CAM cell is an IMAS CAM cell, the first IMS CAM cell and the second IMS CAM cell are of different types. For example but not limited by, when one among the first IMS cell CAM and the second IMS CAM cell is a SLC IMS CAM cell or a MLC IMS CAM cell, while the other one among the first IMS cell CAM and the second IMS CAM cell is a SLC IMAS CAM cell or a MLC IMAS CAM cell, the first IMS CAM cell and the second IMS CAM cell are of different types.

That is, in one embodiment of the application, the first IMS CAM cell and the second IMS CAM cell are selected from a group of: a SLC IMAS CAM cell, an analog IMS CAM cell, a SLC IMS CAM cell, a MLC IMS CAM cell, and a MLC IMAS CAM cell.

Figure 13A:
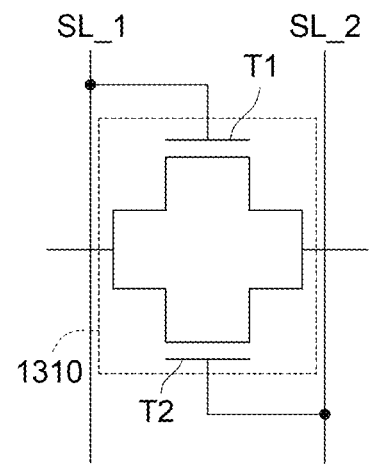
FIG. 13A and FIG. 13B show a SLC IMS CAM cell according to one embodiment of the application.
Figure 13B:
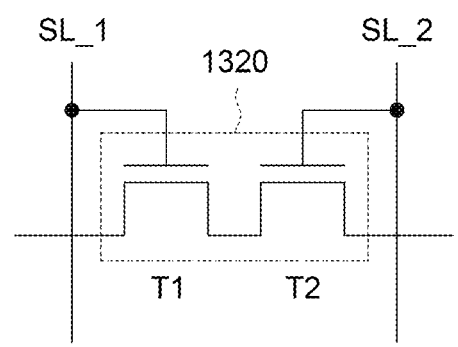

FIG. 13A and FIG. 13B show a SLC IMS CAM cell according to one embodiment of the application.

Refer to FIG. 13A. The SLC IMS CAM cell 1310 includes parallel-coupled flash memory cells T1 and T2. The flash memory cell T1 includes: a first terminal (e.g., gate) receiving a search voltage SL_1; a second terminal (e.g., source) coupled to a second terminal (e.g., source) of the flash memory cell T2; and a third terminal (e.g., drain) coupled to a third terminal (e.g., drain) of the flash memory cell T2. The flash memory cell T2 includes: a first terminal (e.g., gate) receiving a search voltage SL_2; a second terminal (e.g., source) coupled to the second terminal (e.g., source) of the flash memory cell T1; and a third terminal (e.g., drain) coupled to the third terminal (e.g., drain) of the flash memory cell T1.

The operations of the SLC IMS CAM cell 1310 may include erase operation, programming operation and search operation. The details may be described below.

Regarding to an erase operation, an erase voltage may be applied as the search line SL_1 and the search voltage SL_2. Generally, the erase voltage could be a negative bias voltage so that the charge stored in the flash memory cells T1 and T2 could be released.

Regarding to a programming operation, by applying suitable programming voltages on the search voltages SL_1 and SL_2 respectively, to program the threshold voltages of the flash memory cells T1 and T2. While the threshold voltage of the flash memory cell T1 is programmed to a low threshold voltage, and the threshold voltage of the flash memory cell T2 is programmed to a high threshold voltage, the data stored in the SLC IMS CAM cell 1310 is defined as a first value (e.g., 0); while the threshold voltage of the flash memory cell T1 is programmed to the high threshold voltage, and the threshold voltage of the flash memory cell T2 is programmed to the low threshold voltage, the data stored in the SLC IMS CAM cell 1310 is defined as a second value (e.g., 1). In addition to storing the first value and the second value, the SLC IMS CAM cell 1310 could optionally support storing "don't care". While the threshold voltage of the flash memory cell T1 is programmed to the low threshold voltage, and the threshold voltage of the flash memory cell T2 is programmed to the low threshold voltage, the data stored in the SLC IMS CAM cell 1310 is defined as "don't care".

Regarding to a search operation, when searching the first value, the search voltage SL_1 may be applied a first reference searching voltage, the search voltage SL_2 may be applied a second reference searching voltage; when searching the second value, the search voltage SL_1 may be applied the reference second searching voltage, the search voltage SL_2 may be applied the first reference searching voltage. The second reference searching voltage is greater than the high threshold voltage, the high threshold voltage is greater than the first reference searching voltage, and the first reference searching voltage is greater than the low threshold voltage. In addition to searching for the first value and the second value, a "wild card" could be allowable for searching. The wild card refers to the data to be searched could be the first value or the second value. That is, when the wild card is searched, it is considered as "match" whether the SLC IMS CAM cell 1310 stores the first value or the second value. When the wild card is searched, the search voltage SL_1 may be applied the reference second searching voltage, and the search voltage SL_2 may be applied the reference second searching voltage.

Refer to FIG. 13B. The SLC IMS CAM cell 1320 includes serially-coupled flash memory cells T1 and T2. The flash memory cell T1 includes: a first terminal (e.g., gate) receiving a search voltage SL_1; a second terminal (e.g., source) coupled to a signal line; and a third terminal (e.g., drain) coupled to a second terminal (e.g., source) of the flash memory cell T2. The flash memory cell T2 includes: a first terminal (e.g., gate) receiving a search voltage SL_2; a second terminal (e.g., source) coupled to the third terminal (e.g., drain) of the flash memory cell T1; and a third terminal (e.g., drain) coupled to a signal line.

The operations of the SLC IMS CAM cell 1320 may include erase operation, programming operation and search operation. The details may be described below.

Regarding to an erase operation, an erase voltage may be applied to the search voltage SL_1 and the search voltage SL_2. Generally, the erase voltage could be a negative bias voltage so that the charge stored in the flash memory cells T1 and T2 could be released.

Regarding to a programming operation, by applying suitable programming voltages on the search voltage SL_1 and the search voltage SL_2 respectively, to program the threshold voltages of the flash memory cell T1 and the flash memory cell T2. While the threshold voltage of the flash memory cell T1 is programmed to a low threshold voltage, and the threshold voltage of the flash memory cell T2 is programmed to a high threshold voltage, the data stored in the SLC IMS CAM cell 1320 is defined as a first value (e.g., 0); while the threshold voltage of the flash memory cell T1 is programmed to the high threshold voltage, and the threshold voltage of the flash memory cell T2 is programmed to the low threshold voltage, the data stored in the SLC IMS CAM cell 1320 is defined as a second value (e.g., 1). In addition to storing the first value and the second value, the SLC IMS CAM cell 1320 could optionally support storing "don't care". While the threshold voltage of the flash memory cell T1 is programmed to the low threshold voltage, and the threshold voltage of the flash memory cell T2 is programmed to the low threshold voltage, the data stored in the SLC IMS CAM cell 1320 is defined as "don't care".

Regarding to a search operation, when searching the first value, the search voltage SL_1 may be applied a first reference searching voltage, the search voltage SL_2 may be applied a second reference searching voltage; when searching the second value, the search voltage SL_1 may be applied the reference second searching voltage, the search voltage SL_2 may be applied the first reference searching voltage. The second reference searching voltage is greater than the high threshold voltage, the high threshold voltage is greater than the first reference searching voltage, and the first reference searching voltage is greater than the low threshold voltage. In addition to searching for the first value and the second value, a "wild card" could be allowable for searching. The wild card refers to the data to be searched could be the first value or the second value. That is, when the wild card is searched, it is considered as "match" whether the memory cell stores the first value or the second value. When the wild card is searched, the search voltage SL_1 may be applied the second reference searching voltage, and the search voltage SL_2 may be applied the second reference searching voltage.

FIG. 14A to FIG. 14D show MLC IMS CAM cells and the operation according to one embodiment of the present application.

Figure 14A:
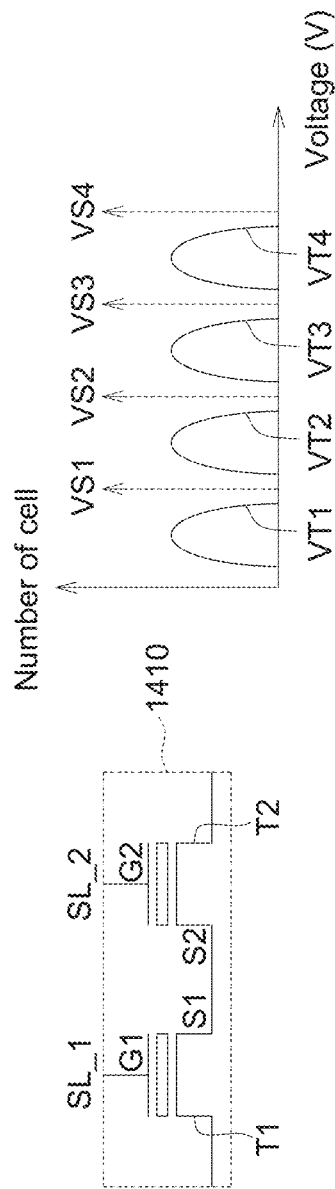
FIG. 14A to FIG. 14D show MLC IMS CAM cells and the operation according to one embodiment of the present application.

FIG. 14A is a schematic diagram of a MLC IMS CAM cell 1410 and its operation according to one embodiment of the present application. As indicated in FIG. 14A, the MLC IMS CAM cell 1410 according to the first embodiment of the present application can be realized by but is not limited to a multi-level CAM (MLC) capable of storing 2 bits.

The MLC IMS CAM cell 1410 includes two serial-coupled flash memory cells T1 and T2, wherein the flash memory cells can be realized but is not limited to floating gate memory cells, silicon-oxide-nitride-oxide-silicon (SONOS) memory cells, floating dot memory cells, ferroelectric FET (FeFET) memory cells.

The gate G1 of the flash memory cell T1 is configured to receive a first search voltage SL_1. The gate G2 of the flash memory cell T2 is configured to receive a second search voltage SL_2. The source S1 of the flash memory cell T1 is electrically connected to the source S2 of the flash memory cell T2.

Moreover, in the embodiment of the present application, the threshold voltage of the flash memory cell T1 (also referred as first threshold voltage); the threshold voltage of the flash memory cell T2 (also referred as second threshold voltage), the first search voltage SL_1 and the second search voltage SL_2 can have different settings. In FIG. 14A, the settings of the first threshold voltage, the second threshold voltage, the first search voltage SL_1 and the second search voltage SL_2 can be obtained with reference to the following tables, and relevant details are omitted here:

| Storage data | 00 | 01 | 10 | 11 | XX (don't care) | Invalid data |
|---|---|---|---|---|---|---|
| First threshold voltage | VT1 | VT2 | VT3 | VT4 | VT1 | ≥VT4 |
| Second threshold voltage | VT4 | VT3 | VT2 | VT1 | VT1 | |

| Search data | 00 | 01 | 10 | 11 | Wildcard (WC) |
|---|---|---|---|---|---|
| First search voltage SL_1 | VS1 | VS2 | VS3 | VS4 | VS4 |

-continued

| Search data | 00 | 01 | 10 | 11 | Wildcard (WC) |
|---|---|---|---|---|---|
| Second search voltage SL_2 | VS4 | VS3 | VS2 | VS1 | VS4 |

In the embodiment of the present application, when the storage data is a first predetermined storage data (00), the first threshold voltage is VT1 (also referred as a minimum threshold voltage value) and the second threshold voltage is VT4 (also referred as a maximum threshold voltage value); when the storage data is a second predetermined storage data (11), the first threshold voltage is the maximum threshold voltage value and the second threshold voltage is the minimum threshold voltage value; when the storage data is a third predetermined storage data (XX don't care), the first threshold voltage and the second threshold voltage both are the minimum threshold voltage value; when the storage data is a fourth predetermined storage data (that is, invalid data), the first threshold voltage and the second threshold voltage both are greater than or equivalent to the maximum threshold voltage value. That is, in the embodiment of the present application, the storage data of the MLC IMS CAM cell 1410 is based on a combination of the first threshold voltage and the second threshold voltage.

In one embodiment of the present application, when the search data is a first predetermined search data (00), the first search voltage SL_1 is VS1 (also referred as a minimum search voltage value) and the second search voltage SL_2 is VS4 (also referred as a maximum search voltage value), wherein the search data represents data to be searched; when the search data is a second predetermined search data (11), the first search voltage SL_1 is the maximum search voltage value and the second search voltage SL_2 is the minimum search voltage value; when the search data is a third predetermined search data (WC), the first search voltage SL_1 and the second search voltage SL_2 both are the maximum search voltage value.

Therefore, during search, when the search data matches the storage data, the flash memory cell T1 and the flash memory cell T2 both generate a matching current, indicating that the search result is "match"; when the search data does not match the storage data, at least one of the flash memory cell T1 and the flash memory cell T2 is not turned on, and no matching current will be generated, indicating that the search result is "mismatch"; when the search data is a wildcard (WC), regardless of the value of the storage data, the flash memory cell T1 and the flash memory cell T2 both generate a matching current, indicating that the search result is "match"; when the storage data is XX (don't care), regardless of the value of the search data, the flash memory cell T1 and the flash memory cell T2 both generate a matching current, indicating that the search result is "match". For example, when the search data (00) matches the storage data (00), the flash memory cell T1 and the flash memory cell T2 both generate a matching current, indicating that the search result is "match"; when the search data (00) does not match the storage data (01), the flash memory cell T1 is turned off but the flash memory cell T2 is turned on, and no matching current will be generated, indicating that the search result is "mismatch".

Figure 14B:
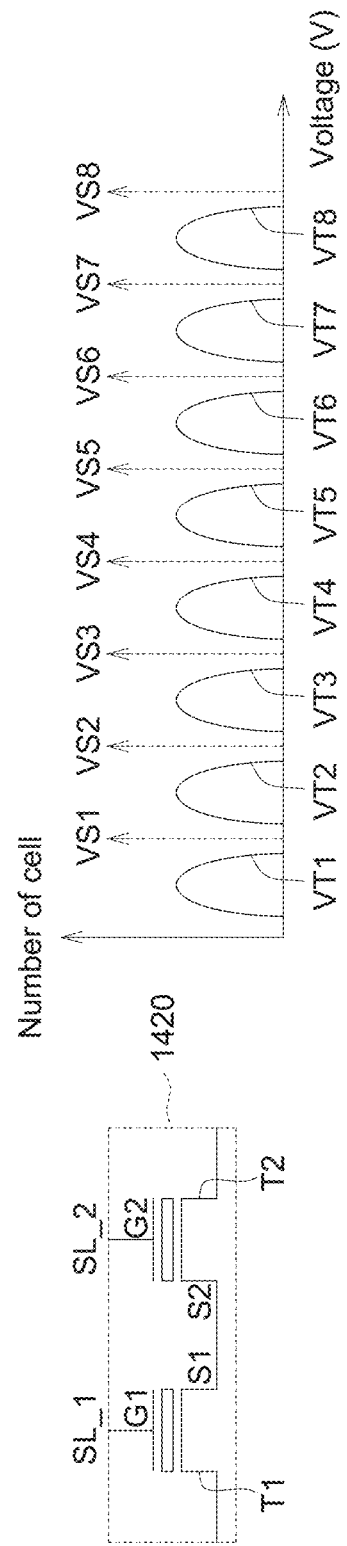

Referring to FIG. 14B, a schematic diagram of a MLC IMS CAM cell 1420 and its operation according to one embodiment of the present application is shown. The MLC IMS CAM cell 1420 can be realized by but is not limited to a triple-level CAM (TLC) capable of storing 3 bits.

In the embodiment of the present application, the first threshold voltage, the second threshold voltage, the first search voltage SL_1 and the second search voltage SL_2 can have different settings. In FIG. 14B, the settings of the first threshold voltage, the second threshold voltage, the first search voltage SL_1 and the second search voltage SL_2 can be obtained with reference to the following tables, and relevant details are omitted here:

| Storage data | First threshold voltage | Second threshold voltage |
|---|---|---|
| 000 | VT1 | VT8 |
| 001 | VT2 | VT7 |
| 010 | VT3 | VT6 |
| 011 | VT4 | VT5 |
| 100 | VT5 | VT4 |
| 101 | VT6 | VT3 |
| 110 | VT7 | VT2 |
| 111 | VT8 | VT1 |
| XXX (don't care) | VT1 | VT1 |
| Invalid data | ≥VT8 | |

| Search data | First search voltage SL_1 | Second search voltage SL_2 |
|---|---|---|
| 000 | VS1 | VS8 |
| 001 | VS2 | VS7 |
| 010 | VS3 | VS6 |
| 011 | VS4 | VS5 |
| 100 | VS5 | VS4 |
| 101 | VS6 | VS3 |
| 110 | VS7 | VS2 |
| 111 | VS8 | VS1 |
| Wildcard (WC) | VS8 | VS8 |

In the embodiment of the present application, when the storage data is a first predetermined storage data (000), the first threshold voltage is VT1 (also referred as a minimum threshold voltage value) and the second threshold voltage is VT8 (also referred as a maximum threshold voltage value); when the storage data is a second predetermined storage data (111), the first threshold voltage is the maximum threshold voltage value and the second threshold voltage is the minimum threshold voltage value; when the storage data is a third predetermined storage data (XXX (don't care), the first threshold voltage and the second threshold voltage both are the minimum threshold voltage value; when the storage data is a fourth predetermined storage data (that is, invalid data), the first threshold voltage and the second threshold voltage both are greater than or equivalent to the maximum threshold voltage value. That is, in the embodiment of the present application, the storage data of the MLC IMS CAM cell 1420 is based on a combination of the first threshold voltage and the second threshold voltage.

In the embodiment of the present application, when the search data is a first predetermined search data (000), the first search voltage SL_1 is VS1 (also referred as a minimum search voltage value) and the second search voltage SL_2 is VS8 (also referred as a maximum search voltage value); when the search data is a second predetermined search data (111), the first search voltage SL_1 is the maximum search voltage value and the second search voltage SL_2 is the minimum search voltage value; when the search data is a third predetermined search data (WC), the first search voltage SL_1 and the second search voltage SL_2 both are the maximum search voltage value.

Therefore, during search, when the search data matches the storage data, the flash memory cell T1 and the flash memory cell T2 both generate a matching current, indicating that the search result is "match"; when the search data does not match the storage data, at least one of the flash memory cell T1 and the flash memory cell T2 is turned on, and no matching current will be generated, indicating that the search result is "mismatch"; when the search data is a wildcard (WC), regardless of the value of the storage data, the flash memory cell T1 and the flash memory cell T2 both generate a matching current, indicating that the search result is "match"; when the storage data is XX (don't care), regardless of the value of the search data, the flash memory cell T1 and the flash memory cell T2 both generate a matching current, indicating that the search result is "match". For example, when the search data (000) matches the storage data (000), the flash memory cell T1 and the flash memory cell T2 both generate a matching current, indicating that the search result is "match"; when the search data (000) does not match the storage data (001), the flash memory cell T1 is turned off but the flash memory cell T2 is turned on, and no matching current will be generated, indicating that the search result is "mismatch".

Figure 14C:
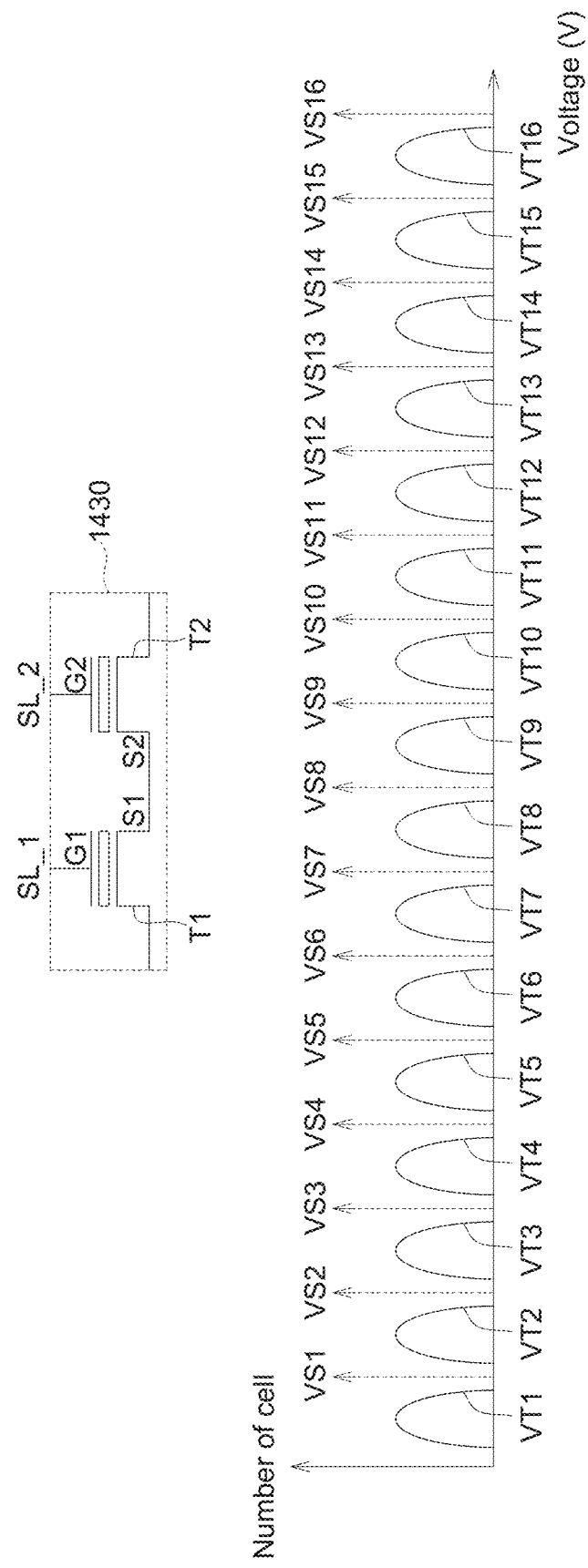

Referring to FIG. 14C, a schematic diagram of a MLC IMS CAM cell 1430 and its operation according to one embodiment of the present application is shown. The MLC IMS CAM cell 1430 can be realized by but is not limited to a quad-level CAM (QLC) capable of storing 4 bits.

In the embodiment of the present application, the first threshold voltage, the second threshold voltage, the first search voltage SL_1 and the second search voltage SL_2 can have different settings. In FIG. 14C, the settings of the first threshold voltage, the second threshold voltage, the first search voltage SL_1 and the second search voltage SL_2 can be obtained with reference to the following tables, and relevant details are omitted here:

| Storage data | First threshold voltage | Second threshold voltage |
|---|---|---|
| 0000 | VT1 | VT16 |
| 0001 | VT2 | VT15 |
| 0010 | VT3 | VT14 |
| 0011 | VT4 | VT13 |
| 0100 | VT5 | VT12 |
| 0101 | VT6 | VT11 |
| 0110 | VT7 | VT10 |
| 0111 | VT8 | VT9 |
| 1000 | VT9 | VT8 |
| 1001 | VT10 | VT7 |
| 1010 | VT11 | VT6 |
| 1011 | VT12 | VT5 |
| 1100 | VT13 | VT4 |
| 1101 | VT14 | VT3 |
| 1110 | VT15 | VT2 |
| 1111 | VT16 | VT1 |
| XXXX (don't care) | VT1 | VT1 |
| Invalid data | ≥VT16 | |

| Search data | First search voltage SL_1 | Second search voltage SL_2 |
|---|---|---|
| 0000 | VS1 | VS16 |
| 0001 | VS2 | VS15 |
| 0010 | VS3 | VS14 |
| 0011 | VS4 | VS13 |
| 0100 | VS5 | VS12 |
| 0101 | VS6 | VS11 |
| 0110 | VS7 | VS10 |
| 0111 | VS8 | VS9 |
| 1000 | VS9 | VS8 |
| 1001 | VS10 | VS7 |
| 1010 | VS11 | VS6 |
| 1011 | VS12 | VS5 |
| 1100 | VS13 | VS4 |
| 1101 | VS14 | VS3 |
| 1110 | VS15 | VS2 |
| 1111 | VS16 | VS1 |
| wildcard (WC) | VS16 | VS16 |

In the embodiment of the present application, when the storage data is a first predetermined storage data (0000), the first threshold voltage is VT1 (also referred as a minimum threshold voltage value) and the second threshold voltage is VT16 (also referred as a maximum threshold voltage value); when the storage data is a second predetermined storage data (1111), the first threshold voltage is the maximum threshold voltage value and the second threshold voltage is the minimum threshold voltage value; when the storage data is a third predetermined storage data (XXXX (don't care), the first threshold voltage and the second threshold voltage both are the minimum threshold voltage value; when the storage data is a fourth predetermined storage data (that is, invalid data), the first threshold voltage and the second threshold voltage both are greater than or equivalent to the maximum threshold voltage value. That is, in the embodiment of the present application, the storage data of the MLC IMS CAM cell 1430 is based on a combination of the first threshold voltage and the second threshold voltage.

In the embodiment of the present application, when the search data is a first predetermined search data (0000), the first search voltage SL_1 is VS1 (also referred as a minimum search voltage value) and the second search voltage SL_2 is VS16 (also referred as a maximum search voltage value); when the search data is a second predetermined search data (1111), the first search voltage SL_1 is the maximum search voltage value and the second search voltage SL_2 is the minimum search voltage value; when the search data is a third predetermined search data (WC), the first search voltage SL_1 and the second search voltage SL_2 both are the maximum search voltage value.

In the embodiment of the present application, when the search data matches the storage data, the flash memory cell T1 and the flash memory cell T2 both generate a matching current, indicating that the search result is "match"; when the search data does not match the storage data, at least one of the flash memory cell T1 and the flash memory cell T2 is not turned on, and no matching current will be generated, indicating that the search result is "mismatch".

Figure 14D:
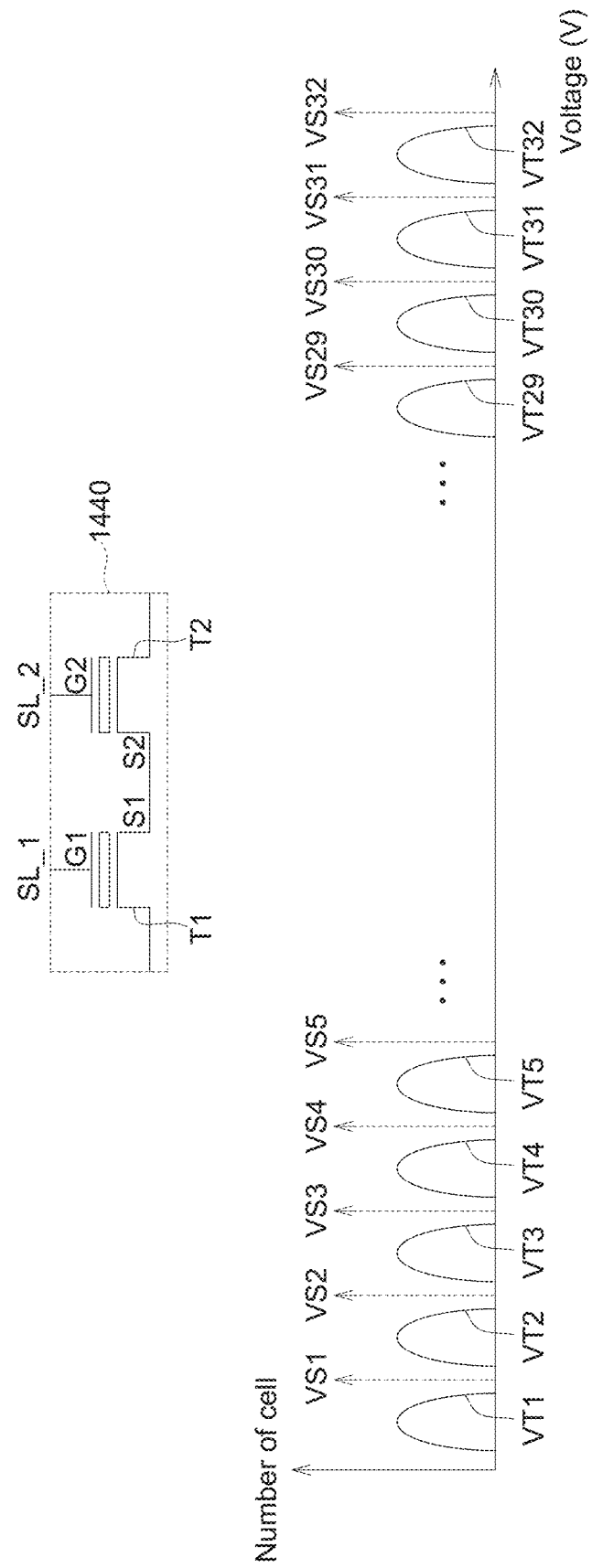

Referring to FIG. 14D, a schematic diagram of a MLC IMS CAM cell 1440 and its operation according to one embodiment of the present application is shown. The MLC IMS CAM cell 1440 can be realized by but is not limited to a penta-level CAM (PLC) capable of storing 5 bits.

In the embodiment of the present application, the first threshold voltage, the second threshold voltage, the first search voltage SL_1 and the second search voltage SL_2 can have different settings. In FIG. 14D, the settings of the first threshold voltage, the second threshold voltage, the first search voltage SL_1 and the second search voltage SL_2 can be obtained with reference to the following tables, and relevant details are omitted here:

| Storage data | First threshold voltage | Second threshold voltage |
|---|---|---|
| 00000 | VT1 | VT32 |
| 00001 | VT2 | VT31 |
| 00010 | VT3 | VT30 |
| 00011 | VT4 | VT29 |
| 00100 | VT5 | VT28 |
| 00101 | VT6 | VT27 |
| 00110 | VT7 | VT26 |
| 00111 | VT8 | VT25 |
| 01000 | VT9 | VT24 |
| 01001 | VT10 | VT23 |
| 01010 | VT11 | VT22 |
| 01011 | VT12 | VT21 |
| 01100 | VT13 | VT20 |
| 01101 | VT14 | VT19 |
| 01110 | VT15 | VT18 |
| 01111 | VT16 | VT17 |
| 10000 | VT17 | VT16 |
| 10001 | VT18 | VT15 |
| 10010 | VT19 | VT14 |
| 10011 | VT20 | VT13 |
| 10100 | VT21 | VT12 |
| 10101 | VT22 | VT11 |
| 10110 | VT23 | VT10 |
| 10111 | VT24 | VT9 |
| 11000 | VT25 | VT8 |
| 11001 | VT26 | VT7 |
| 11010 | VT27 | VT6 |
| 11011 | VT28 | VT5 |
| 11100 | VT29 | VT4 |
| 11101 | VT30 | VT3 |
| 11110 | VT31 | VT2 |
| 11111 | VT32 | VT1 |
| XXXXX (don't care) | VT1 | VT1 |
| Invalid data | ≥VT32 | |

| Search data | First search voltage SL_1 | Second search voltage SL_2 |
|---|---|---|
| 00000 | VS1 | VS32 |
| 00001 | VS2 | VS31 |
| 00010 | VS3 | VS30 |
| 00011 | VS4 | VS29 |
| 00100 | VS5 | VS28 |
| 00101 | VS6 | VS27 |
| 00110 | VS7 | VS26 |
| 00111 | VS8 | VS25 |
| 01000 | VS9 | VS24 |
| 01001 | VS10 | VS23 |
| 01010 | VS11 | VS22 |
| 01011 | VS12 | VS21 |
| 01100 | VS13 | VS20 |
| 01101 | VS14 | VS19 |
| 01110 | VS15 | VS18 |
| 01111 | VS16 | VS17 |
| 10000 | VS17 | VS16 |
| 10001 | VS18 | VS15 |
| 10010 | VS19 | VS14 |
| 10011 | VS20 | VS13 |
| 10100 | VS21 | VS12 |
| 10101 | VS22 | VS11 |
| 10110 | VS23 | VS10 |
| 10111 | VS24 | VS9 |
| 11000 | VS25 | VS8 |
| 11001 | VS26 | VS7 |
| 11010 | VS27 | VS6 |
| 11011 | VS28 | VS5 |
| 11100 | VS29 | VS4 |
| 11101 | VS30 | VS3 |
| 11110 | VS31 | VS2 |
| 11111 | VS32 | VS1 |
| Wildcard (WC) | VS32 | VS32 |

In the embodiment of the present application, when the storage data is a first predetermined storage data (00000), the first threshold voltage is VT1 (also referred as a minimum threshold voltage value) and the second threshold voltage is VT32 (also referred as a maximum threshold voltage value); when the storage data is a second predetermined storage data (11111), the first threshold voltage is the maximum threshold voltage value and the second threshold voltage is the minimum threshold voltage value; when the storage data is a third predetermined storage data (XXXXX (don't care), the first threshold voltage and the second threshold voltage both are the minimum threshold voltage value; when the storage data is a fourth predetermined storage data (that is, invalid data), the first threshold voltage and the second threshold voltage both are greater than or equivalent to the maximum threshold voltage value. That is, in the fourth embodiment of the present application, the storage data of the MLC IMS CAM cell 1440 is based on a combination of the first threshold voltage and the second threshold voltage.

In the embodiment of the present application, when the search data is a first predetermined search data (00000), the first search voltage SL_1 is VS1 (also referred as a minimum search voltage value) and the second search voltage SL_2 is VS32 (also referred as a maximum search voltage value); when the search data is a second predetermined search data (11111), the first search voltage SL_1 is the maximum search voltage value and the second search voltage SL_2 is the minimum search voltage value; when the search data is a third predetermined search data (WC), the first search voltage SL_1 and the second search voltage SL_2 both are the maximum search voltage value.

In the embodiment of the present application, when the search data matches the storage data, the flash memory cell T1 and the flash memory cell T2 both generate a matching current, indicating that the search result is "match"; when the search data does not match the storage data, at least one of the flash memory cell T1 and the flash memory cell T2 is not turned on, and no matching current will be generated, indicating that the search result is "mismatch".

FIG. 15A to FIG. 15G show a MLC IMAS CAM cell and its operations according to one embodiment of the application.

Figure 15A:
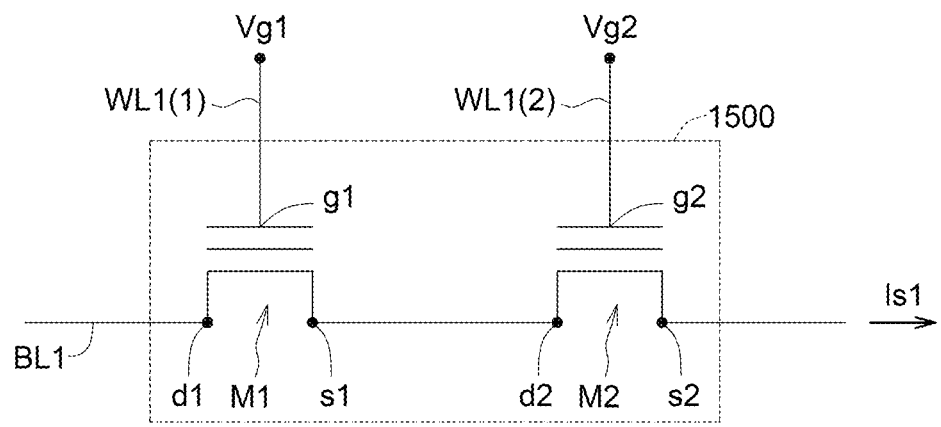
FIG. 15A to FIG. 15G show a MLC IMAS CAM cell and its operations according to one embodiment of the application.
Figure 15B:
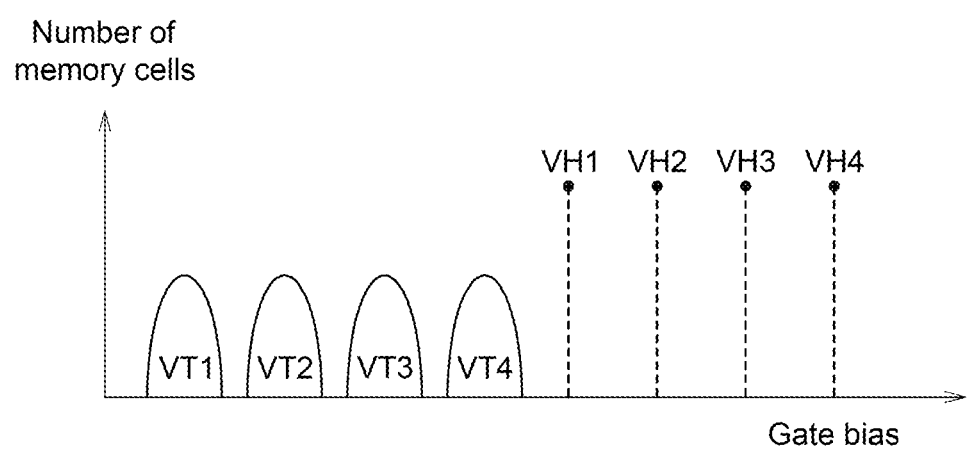

FIG. 15A is a schematic diagram of a MLC IMAS CAM cell 1500 according to an embodiment of the present disclosure. The MLC IMAS CAM cell 1500 is a unit of a memory device, and the memory device is used for performing in-memory search. Referring to FIG. 15A, the MLC IMAS CAM cell 1500 includes two transistors M1, M2 connected in series. The transistor M1 may be referred to as a "first transistor", and the transistor M2 may be referred to as a "second transistor". The transistor M1 includes a first drain d1, a first source s1 and a first gate g1. The transistor M2 includes a second drain d2, a second source s2 and a second gate g2. The first drain d1 of the transistor M1 is connected to one of the bit lines (e.g., the first bit line BL1) of the memory device. The first source s1 of the transistor M1 is connected to the second drain d2 of the transistor M2. The first gate g1 of the transistor M1 and the second gate g2 of the transistor M2 are connected to one set of word lines of the memory device. For example, the first set of word lines WL1 of the memory device includes a first word line WL1(1) and a second word line WL1(2), and the first gate g1 of the transistor M1 is connected to the first word line WL1(1), the second gate g2 of the transistor M2 is connected to the second word line WL1(2).

The transistor M1 has a first threshold voltage Vth1, and the transistor M2 has a second threshold voltage Vth2. The transistors M1 and M2 have floating gates, and a programming voltage may be applied to change the first threshold voltage Vth1 and the second threshold voltage Vth2. In one example, the transistors M1 and M2 are both multi-level cells (MLCs). Both the first threshold voltage Vth1 of the transistor M1 and the second threshold voltage Vth2 of the transistor M2 may be adjusted as a first number of voltage distributions, and the first number is "4". The four voltage distributions refer to, in an order according to magnitude of the voltage, the fourth voltage distribution VT4, the third voltage distribution VT3, the second voltage distribution VT2, and the first voltage distribution VT1. In another example, the transistors M1 and M2 are both triple-level cells (TLCs), the first threshold voltage Vth1 and the second threshold voltage Vth2 may be adjusted as a second number of voltage distributions, the second number is "8". In yet another example, the transistors M1 and M2 are both quad-level cells (QLCs), and both the first threshold voltage Vth1 and the second threshold voltage Vth2 may be adjusted as a third number of voltage distributions, the third number is "16".

The MLC IMAS CAM cell 1500 may store a stored data DAT, wherein the stored data DAT includes a first bit D1 and a second bit D2. The stored data DAT is encoded according to the first threshold voltage Vth1 and the second threshold voltage Vth2. That is, the stored data DAT is encoded according to the first to fourth voltage distributions VT1 to VT4 of the first threshold voltage Vth1 and the first to fourth voltage distributions VT1 to VT4 of the second threshold voltage Vth2, as shown in the following table:

| [Vth1 Vth2] | DAT = [D1 D2] |
|---|---|
| [VT1 VT4] | [0 0] |
| [VT2 VT3] | [0 1] |
| [VT3 VT2] | [1 0] |
| [VT4 VT1] | [1 1] |
| [VT1 VT3] | [0 X] (i.e., [0 0] or [0 1]) |
| [VT1 VT2] | [X 0] (i.e., [1 0] or [0 0]) |
| [VT3 VT1] | [1 X] (i.e., [1 0] or [1 1]) |
| [VT2 VT1] | [X 1] (i.e., [0 1] or [1 1]) |
| [VT4 VT4] | invalid data |
| [VT1 VT1] | DNC (don't care) |

In the example, when the first threshold voltage Vth1 and the second threshold voltage Vth2 are the first voltage distribution VT1 and the fourth voltage distribution VT4, respectively, the first bit D1 and the second bit D2 of the encoded stored data DAT are "0" and "0". When both the first threshold voltage Vth1 and the second threshold voltage Vth2 are the fourth voltage distribution VT4, the encoded stored data DAT is invalid data. When both the first threshold voltage Vth1 and the second threshold voltage Vth2 are the first voltage distribution VT1, the encoded stored data DAT is "don't care" DNC.

Furthermore, when the first threshold voltage Vth1 and the second threshold voltage Vth2 are the first voltage distribution VT1 and the third voltage distribution VT3, respectively, the first bit D1 and the second bit D2 of the encoded stored data DAT are "0" and "X", indicating that the stored data DAT is [0 0] or [0 1]. When the first threshold voltage Vth1 and the second threshold voltage Vth2 are the first voltage distribution VT1 and the second voltage distribution VT2, respectively, the first bit D1 and the second bit D2 of the encoded stored data DAT are "X" and "0", indicating that the stored data DAT is [1 0] or [0 0].

Similarly, When the first threshold voltage Vth1 and the second threshold voltage Vth2 are the third voltage distribution VT3 and the first voltage distribution VT1, respectively, the encoded stored data DAT is [1 X], i.e., the stored data DAT is [1 0] or [1 1]. When the first threshold voltage Vth1 and the second threshold voltage Vth2 are the second voltage distribution VT2 and the first voltage distribution VT1, respectively, the encoded stored data DAT is [X 1], i.e., the stored data DAT is [0 1] or [1 1].

When performing the in-memory search, the transistor M1 receives the first gate bias Vg1 through the first word line WL1(1), and the transistor M2 receives the second gate bias Vg2 through the second word line WL1(2). In operation, the first gate bias Vg1 and the second gate bias Vg2 may be respectively adjusted as a first number of bias values (i.e., 4 bias values) referring to, in an order according to magnitude of the voltage: the fourth bias value VH4, third bias value VH3, second bias value VH2, and first bias value VH1. Moreover, the voltage value of each of the first to fourth bias values VH1-VH4 is greater than the first to fourth voltage distributions VT1-VT4. The relationship of magnitude of voltage is: fourth bias value VH4>third bias value VH3>second bias value VH2>first bias value VH1>fourth voltage distribution VT4>third voltage distribution VT3>second voltage distribution VT2>first voltage distribution VT1. That is, the first bias value VH1 with the lowest voltage value is still greater than the fourth voltage distribution VT4 with the highest voltage value. The relationship of magnitude of voltage between the above-mentioned first to fourth bias values VH1-VH4 and the first to fourth voltage distributions VT1-VT4 may be seen in FIG. 15B.

The MLC IMAS CAM cell 1500 may receive a search data SW, wherein the search data SW includes a first bit S1 and a second bit S2. The search data SW may be encoded according to the first gate bias Vg1 and the second gate bias Vg2. That is, the search data SW is encoded according to the first to fourth bias values VH1-VH4 of the first gate bias Vg1 and the first to fourth bias values VH1-VH4 of the second gate bias Vg2, as shown in the following table:

| [Vg1 Vg2] | SW = [S1 S2] |
|---|---|
| [VH1 VH4] | [0 0] |
| [VH2 VH3] | [0 1] |
| [VH3 VH2] | [1 0] |
| [VH4 VH1] | [1 1] |
| [VH4 VH4] | "Wildcard" WCD |

In the example of the table, when the first gate bias Vg1 and the second gate bias Vg2 are respectively the first bias value VH1 and the fourth bias value VH4, the first bit S1 and the second bit S2 of the encoded search data SW, are "0" and "0". When the first gate bias Vg1 and the second gate bias Vg2 are both the fourth bias value VH4, the encoded search data SW is a "wildcard" WCD.

In operation, there is a first voltage difference between the first gate bias Vg1 received by the transistor M1 and the first threshold voltage Vth1 of the transistor M1, and the transistor M1 generates a current I1 according to the first voltage difference. Similarly, there is a second voltage difference between the second gate bias Vg2 received by the transistor M2 and the second threshold voltage Vth2 of the transistor M2, and the transistor M2 generates a current I2 according to the second voltage difference. Since the transistor M1 is connected to the transistor M2 in series, the current value of the output current Is1 generated by the memory cell 100 on the bit line BL1 is substantially equal to the smaller one of current value of the current I1 and the current I2. The output current Is1 is generated at the second source s2 of the transistor M2.

Figure 15C:
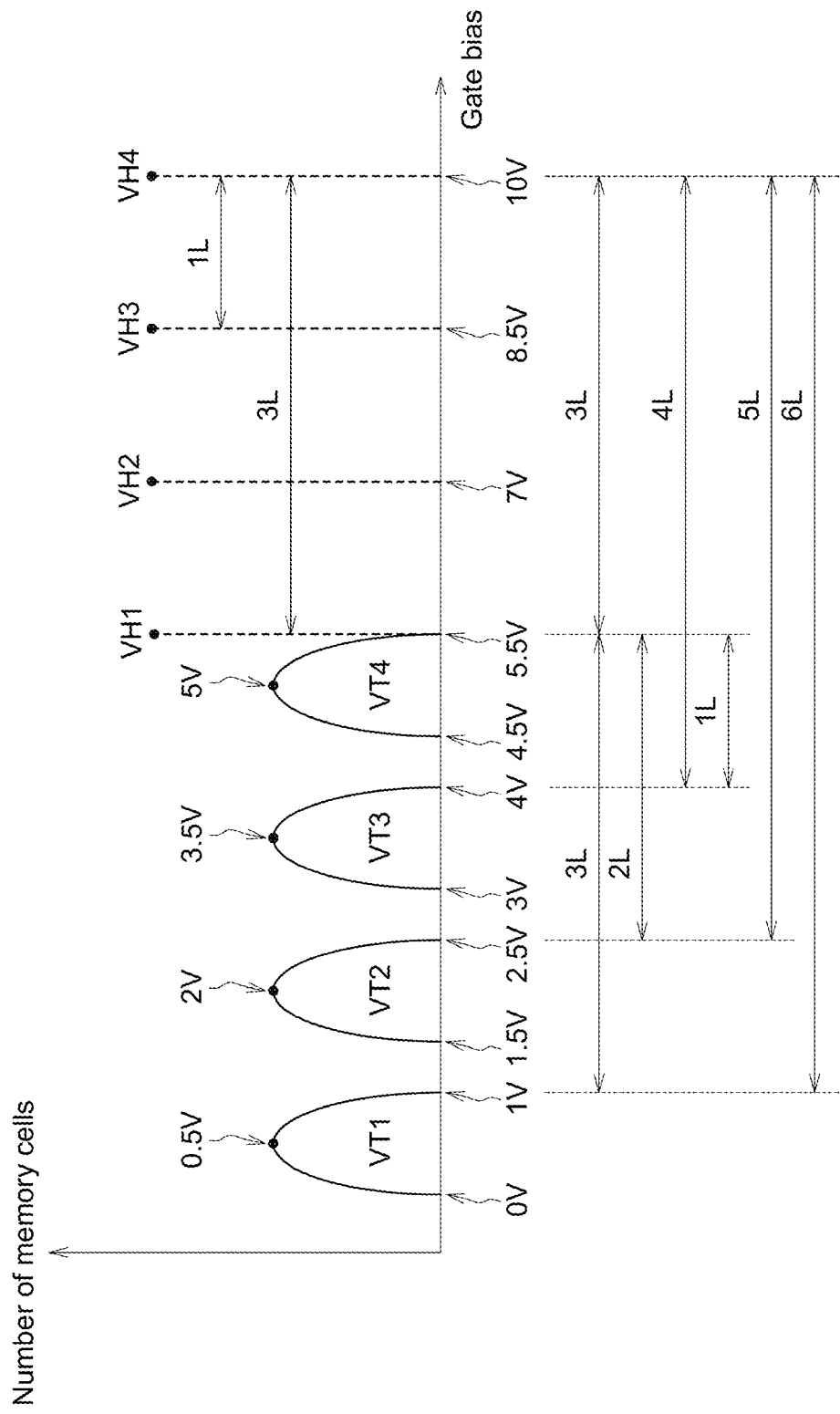

FIG. 15C shows examples of voltage values of the first to fourth bias values VH1-VH4, the first to fourth voltage distributions VT1-VT4, the first voltage difference and the second voltage difference. In the example of FIG. 15C, the first to fourth bias values VH1-VH4 are 5.5V, 7V, 8.5V and 10V, respectively. In addition, the lowest voltage value of the first voltage distribution VT1 is 0V, the highest voltage value is 1V, and the peak voltage value is 0.5V. The lowest voltage value of the second voltage distribution VT2 is 1.5V, the highest voltage value is 2.5V, and the peak voltage value is 2V. The lowest voltage value of the third voltage distribution VT3 is 3V, the highest voltage value is 4V, and the peak voltage value is 3.5V. The lowest voltage value of the fourth voltage distribution VT4 is 4.5V, the highest voltage value is 5.5V, and the peak voltage value is 5V.

In operation, different search data SW may be provided to search the stored data DAT stored in the MLC IMAS CAM cell 1500. FIGS. 15D to 15G are schematic diagrams showing a scenario for searching stored data DAT of different contents when providing search data SW of [0 0]. Please refer to FIG. 15D first, when the search data SW is [0 0], the first gate bias Vg1 received by the transistor M1 is the first bias value VH1, and the second gate bias Vg2 received by the transistor M2 is the fourth bias value VH4. When the stored data DAT is [0 0], the first threshold voltage Vth1 is the first voltage distribution VT1, and the second threshold voltage Vth2 is the fourth voltage distribution VT4.

The first voltage difference between the first gate bias Vg1 of the transistor M1 and the first threshold voltage Vth1 is a "gate overdrive voltage difference". When the search data SW is [0 0] and the stored data DAT is [0 0], the first gate bias Vg1 is the first bias value VH1, and the first threshold voltage Vth1 is the first voltage distribution VT1. The voltage difference between the first bias value VH1 (5.5V) and the highest voltage value (1V) of the first voltage distribution VT1 is 4.5V. That is, the first voltage difference between the first gate bias Vg1 of the transistor M1 and the first threshold voltage Vth1 is 4.5V.

The voltage difference between two adjacent bias values among the first to fourth bias values VH1-VH4 is defined as a predefined level, referred to as "1-level (1L)". Similarly, for the first to fourth voltage distributions VT1-VT4, the voltage difference between respective highest voltage values of the two adjacent voltage distributions is also equal to 1-level (1L). In the embodiment shown in FIG. 15C, the voltage difference between two adjacent bias values is 1.5V, hence 1.5V is taken as the predefined level (i.e., 1-level). Accordingly, the first voltage difference 4.5V of the transistor M1 is 3-level (3L).

On the other hand, when the search data SW is [0 0] and the stored data DAT is [0 0], the voltage difference between the fourth bias value VH4 (10V) of the transistor M2 and the highest voltage value (5.5V) of the fourth voltage distribution VT4 is 4.5V. That is, the second voltage difference between the second gate bias Vg2 of the transistor M2 and the second threshold voltage Vth2 is 4.5V, which is 3-level (3L).

The current value of the current I1 generated by the transistor M1 corresponds to the first voltage difference of the transistor M1 (which is 3-level (3L)), and the current value of the current I2 generated by the transistor M2 corresponds to the second voltage difference (which is 3-level (3L)). The current I1 is equal to the current I2, hence the current value of the output current Is1 generated by the memory cell 100 is equal to the current I1 and the current I2. The gate overdrive voltage difference corresponding to the current value of the output current Is1 is 3-level (3L).

Both the stored data DAT and the search data SW are [0 0], and the mismatch distance between the stored data DAT and the search data SW is "0" (i.e., a complete match). When the stored data DAT and the search data SW are completely matched, the gate overdrive voltage difference corresponding to the current value of the output current Is1 is three-level (3L).

Figure 15F:
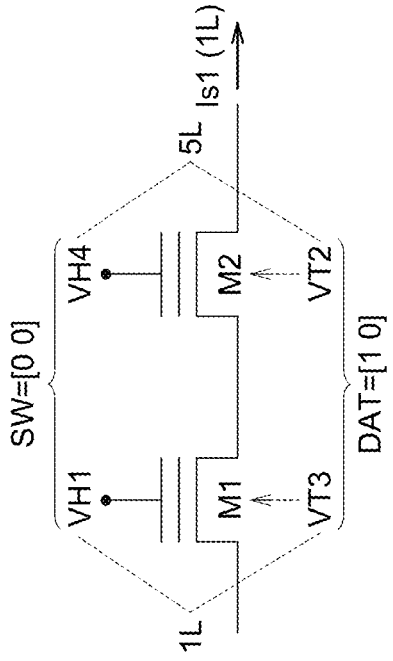
Figure 15G:
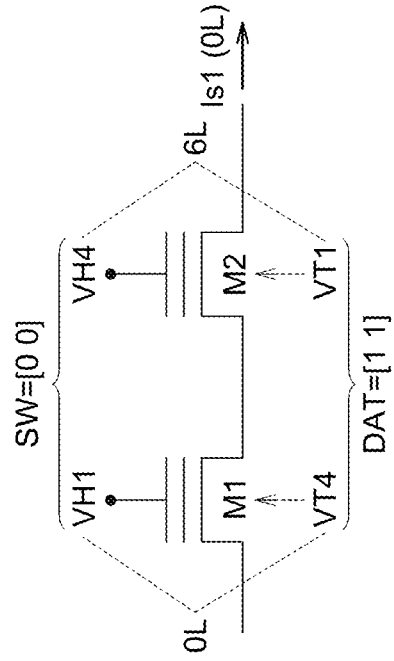
Figure 15D:
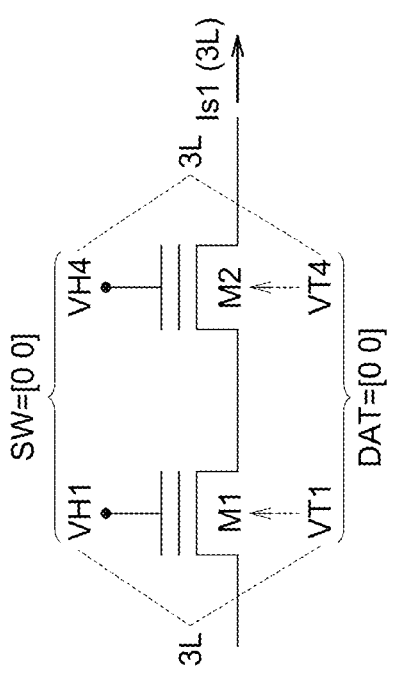
Figure 15E:
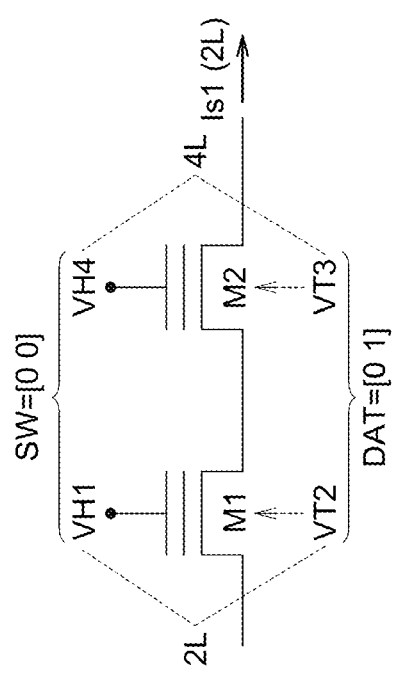

Next, referring to FIG. 15E, when the search data SW is [0 0] and the stored data DAT is [0 1], a mismatch distance between the stored data DAT and the search data SW is "1". The first voltage difference between the first bias value VH1 (5.5V) of the transistor M1 and the highest voltage value (2.5V) of the second voltage distribution VT2 is 3V (i.e., 2-level (2L)). The second voltage difference between the fourth bias value VH4 (10V) of the transistor M2 and the highest voltage value (4V) of the third voltage distribution VT3 is 6V (i.e., 4-level (4L)).

Accordingly, the current value of the current I1 corresponds to the first voltage difference of the transistor M1 (which is 2-level (2L)), and the current value of the current I2 corresponds to the second voltage difference of the transistor M2 (which is 4-level (4L)). The current I1 is smaller than the current I2, the output current Is1 generated by the memory cell 100 is the smaller one of the current I1 and the current I2, and the current value of the output current Is1 is equal to the current I1. The gate overdrive voltage difference corresponding to the current value of the output current Is1 is 2-level (2L).

Next, referring to FIG. 15F, when the search data SW is [0 0] and the stored data DAT is [1 0], the mismatch distance between the stored data DAT and the search data SW is "2". The first voltage difference between the first bias value VH1 (5.5V) of the transistor M1 and the highest voltage value (4V) of the third voltage distribution VT3 is 1.5V (i.e., 1-level (1L)). The second voltage difference between the fourth bias value VH4 (10V) of the transistor M2 and the highest voltage value (2.5V) of the second voltage distribution VT2 is 7.5V (i.e., 5-level (5L)). The current I1 is less than the current I2, the current value of the output current Is1 is equal to the current I1, and the gate overdrive voltage difference corresponding to the current value of the output current Is1 is 1-level (1L).

Next, referring to FIG. 15G, when the search data SW is [0 0] and the stored data DAT is [1 1], the mismatch distance between the stored data DAT and the search data SW is "3". The first voltage difference between the first bias value VH1 (5.5V) of the transistor M1 and the highest voltage value (5.5V) of the fourth voltage distribution VT4 is 0V (i.e., 0-level (0L)). The first voltage difference between the fourth bias value VH4 (10V) of the transistor M2 and the highest voltage value (1V) of the first voltage distribution VT1 is 9V (i.e., 6-level (6L)). Accordingly, the gate overdrive voltage difference corresponding to the current value of the output current Is1 is 0-level (0L).

From the above, when the mismatch distance between the search data SW and the stored data DAT is "0", "1", "2" and "3", the gate overdrive corresponding to the current value of the output current Is1 are "3L", "2L", "1L" and "0L". When the mismatch degree between the search data SW and the stored data DAT is higher, the mismatch distance is larger, and the current value of the output current Is1 is smaller. Accordingly, the mismatch distance and mismatch degree between the search data SW and the stored data DAT may be determined according to the current value of the output current Is1 of the memory cell 100.

That is to say, in the MLC IMAS CAM cell according to the embodiment of the application as shown in FIG. 15A to FIG. 15G, the stored data is encoded according to the first threshold voltage and the second threshold voltage, the search data is encoded according to the first gate bias and the second gate bias, there is a mismatch distance between the stored data and the search data, and an output current generated by each of the memory cells is related to the mismatch distance.

Figure 16:
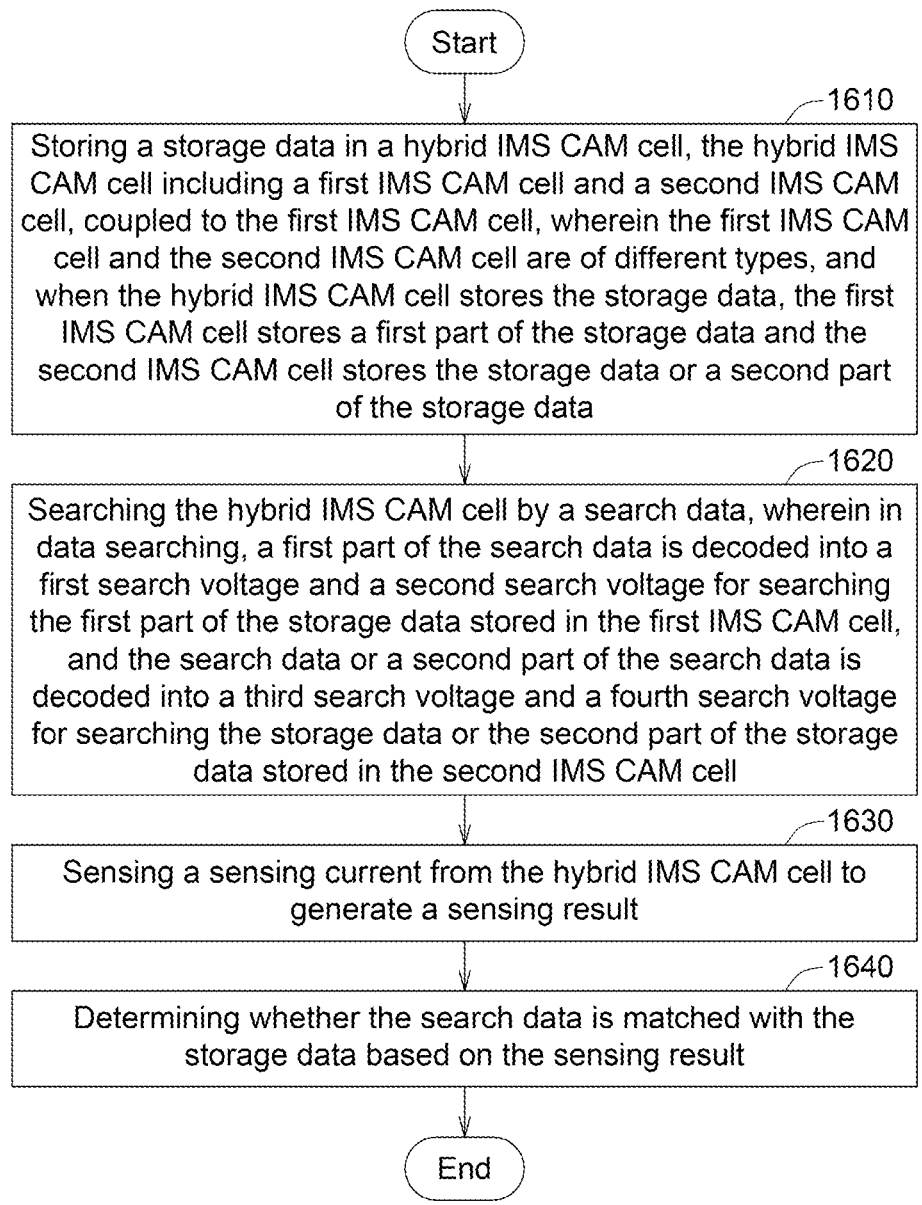
FIG. 16 shows a hybrid in-memory search (IMS) content addressable memory (CAM) data search method according to one embodiment of the application.

FIG. 16 shows a hybrid in-memory search (IMS) content addressable memory (CAM) data search method according to one embodiment of the application. The hybrid IMS CAM data search method includes: (1610) storing a storage data in a hybrid IMS CAM cell, the hybrid IMS CAM cell including a first IMS CAM cell and a second IMS CAM cell, coupled to the first IMS CAM cell, wherein the first IMS CAM cell and the second IMS CAM cell are of different types, and when the hybrid IMS CAM cell stores the storage data, the first IMS CAM cell stores a first part of the storage data and the second IMS CAM cell stores the storage data or a second part of the storage data; (1620) searching the hybrid IMS CAM cell by a search data, wherein in data searching, a first part of the search data is decoded into a first search voltage and a second search voltage for searching the first part of the storage data stored in the first IMS CAM cell, and the search data or a second part of the search data is decoded into a third search voltage and a fourth search voltage for searching the storage data or the second part of the storage data stored in the second IMS CAM cell; (1630) sensing a sensing current from the hybrid IMS CAM cell to generate a sensing result; and (1640) determining whether the search data is matched with the storage data based on the sensing result.

The SLC IMAS CAM cell may provide high system stability and the analog IMS CAM cell may improve search accuracy. Thus, the hybrid IMS CAM cell of the embodiment of the application has high search accuracy, high content density and high search stability.

In one embodiment of the application, the hybrid IMS CAM cell and the hybrid IMS CAM memory device may be applied in two-dimension structure or three-dimension structure.

In one embodiment of the application, the hybrid IMS CAM cell and the hybrid IMS CAM memory device may have good performance and thus is applicable in many fields, for example but not limited by, Big-data searching, AI hardware accelerator/classifier, Approximate Computing, Associative memory, few-shot learning, SSD (single source data) managements, deoxyribonucleic acid (DNA) matching, Data filter and so on.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A hybrid in-memory search (IMS) content addressable memory (CAM) cell including:
   a first IMS CAM cell; and
   a second IMS CAM cell, coupled to the first IMS CAM cell,
   wherein,
   the first IMS CAM cell and the second IMS CAM cell are of different types, and
   when the hybrid IMS CAM cell stores a storage data, the first IMS CAM cell stores a first part of the storage data and the second IMS CAM cell stores the storage data or a second part of the storage data.

2. The hybrid IMS CAM cell according to claim 1, wherein
   when the first IMS CAM cell and the second IMS CAM cell have different storage bit number, the first IMS CAM cell and the second IMS CAM cell are of different types; or
   when one among the first IMS CAM cell and the second IMS CAM cell stores a digital value while the other one among the first IMS CAM cell and the second IMS CAM cell stores an analog value, the first IMS CAM cell and the second IMS CAM cell are of different types; or
   when one among the first IMS CAM cell and the second IMS CAM cell is an IMS cell while the other one among the first IMS CAM cell and the second IMS CAM cell is an in-memory approximate search (IMAS) cell, the first IMS CAM cell and the second IMS CAM cell are of different types.

3. The hybrid IMS CAM cell according to claim 1, wherein
   the first IMS CAM cell and the second IMS CAM cell are selected from a group of: a single-level cell (SLC) IMAS CAM cell, an analog IMS CAM cell, a SLC IMS CAM cell, a multi-level cell (MLC) IMS CAM cell and a MLC IMAS CAM cell.

4. The hybrid IMS CAM cell according to claim 3, wherein
   the SLC IMAS CAM cell includes a first memory cell and a second memory cell in cascade;
   when a first predetermined storage data is stored in the SLC IMAS CAM cell, a first threshold voltage of the first memory cell is a first reference threshold voltage and a second threshold voltage of the second memory cell is a second reference threshold voltage;
   when a second predetermined storage data is stored in the SLC IMAS CAM cell, the first threshold voltage of the first memory cell is the second reference threshold voltage and the second threshold voltage of the second memory cell is the first reference threshold voltage;
   when a third predetermined storage data is stored in the SLC IMAS CAM cell, the first threshold voltage of the first memory cell and the second threshold voltage of the second memory cell are both the first reference threshold voltage; and
   when a fourth predetermined storage data is stored in the SLC IMAS CAM cell, the first threshold voltage of the first memory cell and the second threshold voltage of the second memory cell are both the second reference threshold voltage;
   when the search data is a first predetermined search data, a first search voltage applied to the first memory cell is a first reference search voltage and a second search voltage applied to the second memory cell is a second reference search voltage;
   when the search data is a second predetermined search data, the first search voltage applied to the first memory cell is the second reference search voltage and the second search voltage applied to the second memory cell is the first reference search voltage;
   when the search data is a third predetermined search data, the first search voltage applied to the first memory cell and the second search voltage applied to the second memory cell are both the second reference search voltage; and when the search data is a fourth predetermined search data, the first search voltage applied to the first memory cell and the second search voltage applied to the second memory cell are both the first reference search voltage, wherein the first reference search voltage is lower than the second reference search voltage.

5. The hybrid IMS CAM cell according to claim 4, wherein the analog IMS CAM cell includes a third and a fourth memory cells coupled in serial, the third and fourth second memory cells having a third threshold voltage and a fourth threshold voltage, respectively;

in data searching, an analog search data is converted into a third analog search voltage and a fourth analog search voltage;

the third and the fourth memory cells receive the third analog search voltage and the fourth analog search voltage;

when the third analog search voltage and the fourth analog search voltage match with a match range, the analog CAM cell generates a memory cell; and when the third analog search voltage and the fourth analog search voltage does not match with the match range, the analog CAM cell generates no memory cell.

6. The hybrid IMS CAM cell according to claim 3, wherein the SLC IMS CAM cell includes a first and a second memory cells coupled in serial or in parallel;

the first and the second memory cells receive a first search voltage and a second search voltage;

in an erase operation, an erase voltage is applied as the first search voltage and the second search voltage, and the erase voltage is a negative bias voltage;

in a programming operation, a programming voltage is applied as the first search voltage and the second search voltage to program a first and a second threshold voltages of the first and the second memory cells to define a storage data stored in the SLC IMS CAM cell;

in a search operation, the first search voltage is applied by a first reference searching voltage or a second reference searching voltage, the second search voltage is applied by the first reference searching voltage or the second reference searching voltage, the second reference searching voltage is greater than a first reference threshold voltage, the first reference threshold voltage is greater than the first reference searching voltage, and the first reference searching voltage is greater than a second reference threshold voltage.

7. The hybrid IMS CAM cell according to claim 3, wherein the MLC IMS CAM cell includes a first and a second memory cell coupled in series, the first memory cell receiving a first search voltage, the second memory cell receiving a second search voltage, a storage data of the MLC IMS CAM cell is determined based on a combination of a plurality of threshold voltages of the first memory cell and the second memory cell, when the storage data is a first predetermined storage data, a first threshold voltage of the first memory cell is a minimum threshold voltage value and a second threshold voltage of the second memory cell is a maximum threshold voltage value; when the storage data is a second predetermined storage data, the first threshold voltage is the maximum threshold voltage value and the second threshold voltage is the minimum threshold voltage value; when the storage data is a third predetermined storage data, the first threshold voltage and the second threshold voltage both are the minimum threshold voltage value; and when the storage data is a fourth predetermined storage data, the first threshold voltage and the second threshold voltage both are greater than or equivalent to the maximum threshold voltage value.

8. The hybrid IMS CAM cell according to claim 3, wherein the MLC IMAS CAM cell stores a storage data and receives a search data, the MLC IMAS CAM cell includes: a first transistor, having a first threshold voltage and receiving a first gate bias; and a second transistor, connected to the first transistor, the second transistor has a second threshold voltage and receives a second gate bias;

wherein, the storage data is encoded according to the first threshold voltage and the second threshold voltage, the search data is encoded according to the first gate bias and the second gate bias, there is a mismatch distance between the storage data and the search data, and an output current generated by the MLC IMAS CAM cell is related to the mismatch distance.

9. A hybrid in-memory search (IMS) content addressable memory (CAM) memory device including:

a hybrid IMS CAM memory array including a plurality of hybrid IMS CAM cells, a plurality of word lines and a plurality of bit lines, the hybrid IMS CAM cells coupled to the plurality of word lines and the plurality of bit lines;

a word line driving circuit coupled to the word lines, based on a plurality of search data, the word line driving circuit applying a plurality of search voltages to the hybrid IMS CAM cells for searching the hybrid IMS CAM cells;

a bit line driving circuit coupled to the bit lines, for applying a plurality of bit line driving voltages to the bit lines; and a sensing amplifier coupled to the hybrid IMS CAM cells, for receiving a plurality of sensing currents from the hybrid IMS CAM cells to decide whether the search data is matched with a plurality of storage data stored in the hybrid IMS CAM cells, wherein the hybrid IMS CAM cell includes a first IMS CAM cell and a second IMS CAM cell, coupled to the first IMS CAM cell, the first IMS CAM cell and the second IMS CAM cell are of different types, when the hybrid IMS CAM cell stores a storage data, the first IMS CAM cell stores a first part of the storage data and the second IMS CAM cell stores the storage data or a second part of the storage data, and wherein in data searching, a first part of the search data is decoded into a first search voltage and a second search voltage for searching the first part of the storage data stored in the first IMS CAM cell, and the search data or a second part of the search data is decoded into a third search voltage and a fourth search voltage for searching the storage data or the second part of the storage data stored in the second IMS CAM cell.

10. The hybrid IMS CAM memory device according to claim 9, wherein when the first IMS CAM cell and the second IMS CAM cell have different storage bit number, the first IMS CAM cell and the second IMS CAM cell are of different types, or when one among the first IMS CAM cell and the second IMS CAM cell stores a digital value while the other one among the first IMS CAM cell and the second IMS CAM cell stores an analog value, the first IMS CAM cell and the second IMS CAM cell are of different types, or when one among the first IMS CAM cell and the second IMS CAM cell is an IMS cell while the other one among the first IMS CAM cell and the second IMS CAM cell is an in-memory approximate search (IMAS) cell, the first IMS CAM cell and the second IMS CAM cell are of different types.

11. The hybrid IMS CAM memory device according to claim 9, wherein
the first IMS CAM cell and the second IMS CAM cell are selected from a group of: a single-level cell (SLC) IMAS CAM cell, an analog IMS CAM cell, a SLC IMS CAM cell, a multi-level cell (MLC) IMS CAM cell and a MLC IMAS CAM cell.

12. The hybrid IMS CAM memory device according to claim 11, wherein
the SLC IMAS CAM cell includes a first memory cell and a second memory cell in cascade;
when a first predetermined storage data is stored in the SLC IMAS CAM cell, a first threshold voltage of the first memory cell is a first reference threshold voltage and a second threshold voltage of the second memory cell is a second reference threshold voltage;
when a second predetermined storage data is stored in the SLC IMAS CAM cell, the first threshold voltage of the first memory cell is the second reference threshold voltage and the second threshold voltage of the second memory cell is the first reference threshold voltage;
when a third predetermined storage data is stored in the SLC IMAS CAM cell, the first threshold voltage of the first memory cell and the second threshold voltage of the second memory cell are both the first reference threshold voltage; and
when a fourth predetermined storage data is stored in the SLC IMAS CAM cell, the first threshold voltage of the first memory cell and the second threshold voltage of the second memory cell are both the second reference threshold voltage;
when the search data is a first predetermined search data, a first search voltage applied to the first memory cell is a first reference search voltage and a second search voltage applied to the second memory cell is a second reference search voltage;
when the search data is a second predetermined search data, the first search voltage applied to the first memory cell is the second reference search voltage and the second search voltage applied to the second memory cell is the first reference search voltage;
when the search data is a third predetermined search data, the first search voltage applied to the first memory cell and the second search voltage applied to the second memory cell are both the second reference search voltage; and
when the search data is a fourth predetermined search data, the first search voltage applied to the first memory cell and the second search voltage applied to the second memory cell are both the first reference search voltage, wherein the first reference search voltage is lower than the second reference search voltage.

13. The hybrid IMS CAM memory device according to claim 12, wherein
the analog IMS CAM cell includes a third and a fourth memory cells coupled in serial, the third and fourth second memory cells having a third threshold voltage and a fourth threshold voltage, respectively;
in data searching, an analog search data is converted into a third analog search voltage and a fourth analog search voltage;
the third and the fourth memory cells receive the third analog search voltage and the fourth analog search voltage;
when the third analog search voltage and the fourth analog search voltage match with a match range, the analog CAM cell generates a memory cell; and
when the third analog search voltage and the fourth analog search voltage does not match with the match range, the analog CAM cell generates no memory cell.

14. The hybrid IMS CAM memory device according to claim 11, wherein
the SLC IMS CAM cell includes a first and a second memory cells coupled in serial or in parallel;
the first and the second memory cells receive a first search voltage and a second search voltage;
in an erase operation, an erase voltage is applied as the first search voltage and the second search voltage, and the erase voltage is a negative bias voltage;
in a programming operation, a programming voltage is applied as the first search voltage and the second search voltage to program a first and a second threshold voltages of the first and the second memory cells to define a storage data stored in the SLC IMS CAM cell;
in a search operation, the first search voltage is applied by a first reference searching voltage or a second reference searching voltage, the second search voltage is applied by the first reference searching voltage or the second reference searching voltage, the second reference searching voltage is greater than a first reference threshold voltage, the first reference threshold voltage is greater than the first reference searching voltage, and the first reference searching voltage is greater than a second reference threshold voltage.

15. The hybrid IMS CAM memory device according to claim 11, wherein
the MLC IMS CAM cell includes a first and a second memory cell coupled in series, the first memory cell receiving a first search voltage, the second memory cell receiving a second search voltage,
a storage data of the MLC IMS CAM cell is determined based on a combination of a plurality of threshold voltages of the first memory cell and the second memory cell,
when the storage data is a first predetermined storage data, a first threshold voltage of the first memory cell is a minimum threshold voltage value and a second threshold voltage of the second memory cell is a maximum threshold voltage value; when the storage data is a second predetermined storage data, the first threshold voltage is the maximum threshold voltage value and the second threshold voltage is the minimum threshold voltage value; when the storage data is a third predetermined storage data, the first threshold voltage and the second threshold voltage both are the minimum threshold voltage value; and when the storage data is a fourth predetermined storage data, the first threshold voltage and the second threshold voltage both are greater than or equivalent to the maximum threshold voltage value.

16. The hybrid IMS CAM memory device according to claim 11, wherein
the MLC IMAS CAM cell stores a storage data and receives a search data,
the MLC IMAS CAM cell includes: a first transistor, having a first threshold voltage and receiving a first gate bias; and a second transistor, connected to the first transistor, the second transistor has a second threshold voltage and receives a second gate bias;
wherein, the storage data is encoded according to the first threshold voltage and the second threshold voltage, the search data is encoded according to the first gate bias and the second gate bias, there is a mismatch distance between the storage data and the search data, and an output current generated by the MLC IMAS CAM cell is related to the mismatch distance.

17. A hybrid in-memory search (IMS) content addressable memory (CAM) data search method including:
storing a storage data in a hybrid IMS CAM cell, the hybrid IMS CAM cell including a first IMS CAM cell and a second IMS CAM cell, coupled to the first IMS CAM cell, wherein the first IMS CAM cell and the second IMS CAM cell are of different types, and when the hybrid IMS CAM cell stores the storage data, the first IMS CAM cell stores a first part of the storage data and the second IMS CAM cell stores the storage data or a second part of the storage data;
searching the hybrid IMS CAM cell by a search data, wherein in data searching, a first part of the search data is decoded into a first search voltage and a second search voltage for searching the first part of the storage data stored in the first IMS CAM cell, and the search data or a second part of the search data is decoded into a third search voltage and a fourth search voltage for searching the storage data or the second part of the storage data stored in the second IMS CAM cell;
sensing a sensing current from the hybrid IMS CAM cell to generate a sensing result; and
determining whether the search data is matched with the storage data based on the sensing result.

18. The hybrid IMS CAM data search method according to claim 17, wherein
when the first IMS CAM cell and the second IMS CAM cell have different storage bit number, the first IMS CAM cell and the second IMS CAM cell are of different types, or
when one among the first IMS CAM cell and the second IMS CAM cell stores a digital value while the other one among the first IMS CAM cell and the second IMS CAM cell stores an analog value, the first IMS CAM cell and the second IMS CAM cell are of different types, or
when one among the first IMS CAM cell and the second IMS CAM cell is an IMS cell while the other one among the first IMS CAM cell and the second IMS CAM cell is an in-memory approximate search (IMAS) cell, the first IMS CAM cell and the second IMS CAM cell are of different types.

19. The hybrid IMS CAM data search method according to claim 17, wherein
the first IMS CAM cell and the second IMS CAM cell are selected from a group of: a single-level cell (SLC) IMAS CAM cell, an analog IMS CAM cell, a SLC IMS CAM cell, a multi-level cell (MLC) IMS CAM cell and a MLC IMAS CAM cell.

20. The hybrid IMS CAM data search method according to claim 19, wherein
the SLC IMAS CAM cell includes a first memory cell and a second memory cell in cascade;
when a first predetermined storage data is stored in the SLC IMAS CAM cell, a first threshold voltage of the first memory cell is a first reference threshold voltage and a second threshold voltage of the second memory cell is a second reference threshold voltage;
when a second predetermined storage data is stored in the SLC IMAS CAM cell, the first threshold voltage of the first memory cell is the second reference threshold voltage and the second threshold voltage of the second memory cell is the first reference threshold voltage;
when a third predetermined storage data is stored in the SLC IMAS CAM cell, the first threshold voltage of the first memory cell and the second threshold voltage of the second memory cell are both the first reference threshold voltage; and
when a fourth predetermined storage data is stored in the SLC IMAS CAM cell, the first threshold voltage of the first memory cell and the second threshold voltage of the second memory cell are both the second reference threshold voltage;
when the search data is a first predetermined search data, a first search voltage applied to the first memory cell is a first reference search voltage and a second search voltage applied to the second memory cell is a second reference search voltage;
when the search data is a second predetermined search data, the first search voltage applied to the first memory cell is the second reference search voltage and the second search voltage applied to the second memory cell is the first reference search voltage;
when the search data is a third predetermined search data, the first search voltage applied to the first memory cell and the second search voltage applied to the second memory cell are both the second reference search voltage; and
when the search data is a fourth predetermined search data, the first search voltage applied to the first memory cell and the second search voltage applied to the second memory cell are both the first reference search voltage,
wherein the first reference search voltage is lower than the second reference search voltage.

21. The hybrid IMS CAM data search method according to claim 20, wherein
the analog IMS CAM cell includes a third and a fourth memory cells coupled in serial, the third and fourth second memory cells having a third threshold voltage and a fourth threshold voltage, respectively;
in data searching, an analog search data is converted into a third analog search voltage and a fourth analog search voltage;
the third and the fourth memory cells receive the third analog search voltage and the fourth analog search voltage;
when the third analog search voltage and the fourth analog search voltage match with a match range, the analog CAM cell generates a memory cell; and
when the third analog search voltage and the fourth analog search voltage does not match with the match range, the analog CAM cell generates no memory cell.

22. The hybrid IMS CAM data search method according to claim 19, wherein
the SLC IMS CAM cell includes a first and a second memory cells coupled in serial or in parallel;
the first and the second memory cells receive a first search voltage and a second search voltage;
in an erase operation, an erase voltage is applied as the first search voltage and the second search voltage, and the erase voltage is a negative bias voltage;
in a programming operation, a programming voltage is applied as the first search voltage and the second search voltage to program a first and a second threshold voltages of the first and the second memory cells to define a storage data stored in the SLC IMS CAM cell;
in a search operation, the first search voltage is applied by a first reference searching voltage or a second reference searching voltage, the second search voltage is applied by the first reference searching voltage or the second reference searching voltage, the second reference searching voltage is greater than a first reference threshold voltage, the first reference threshold voltage is greater than the first reference searching voltage, and the first reference searching voltage is greater than a second reference threshold voltage.

23. The hybrid IMS CAM data search method according to claim 19, wherein
the MLC IMS CAM cell includes a first and a second memory cell coupled in series, the first memory cell receiving a first search voltage, the second memory cell receiving a second search voltage,
a storage data of the MLC IMS CAM cell is determined based on a combination of a plurality of threshold voltages of the first memory cell and the second memory cell,
when the storage data is a first predetermined storage data, a first threshold voltage of the first memory cell is a minimum threshold voltage value and a second threshold voltage of the second memory cell is a maximum threshold voltage value; when the storage data is a second predetermined storage data, the first threshold voltage is the maximum threshold voltage value and the second threshold voltage is the minimum threshold voltage value; when the storage data is a third predetermined storage data, the first threshold voltage and the second threshold voltage both are the minimum threshold voltage value; and when the storage data is a fourth predetermined storage data, the first threshold voltage and the second threshold voltage both are greater than or equivalent to the maximum threshold voltage value.

24. The hybrid IMS CAM data search method according to claim 19, wherein
the MLC IMAS CAM cell stores a storage data and receives a search data,
the MLC IMAS CAM cell includes: a first transistor, having a first threshold voltage and receiving a first gate bias; and a second transistor, connected to the first transistor, the second transistor has a second threshold voltage and receives a second gate bias;
wherein, the storage data is encoded according to the first threshold voltage and the second threshold voltage, the search data is encoded according to the first gate bias and the second gate bias, there is a mismatch distance between the storage data and the search data, and an output current generated by the MLC IMAS CAM cell is related to the mismatch distance.

* * * * *